(12) United States Patent
Oshima et al.

(10) Patent No.: US 10,398,027 B2
(45) Date of Patent: Aug. 27, 2019

(54) WIRING BOARD

(71) Applicant: SHINKO ELECTRIC INDUSTRIES CO., LTD., Nagano-shi, Nagano (JP)

(72) Inventors: Kazuhiro Oshima, Nagano (JP); Junji Sato, Nagano (JP); Hitoshi Kondo, Nagano (JP); Katsuya Fukase, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/207,446

(22) Filed: Dec. 3, 2018

(65) Prior Publication Data
US 2019/0181084 A1 Jun. 13, 2019

(30) Foreign Application Priority Data
Dec. 8, 2017 (JP) .................. 2017-236050

(51) Int. Cl.
| | |
|---|---|
| *H05K 1/02* | (2006.01) |
| *H01L 23/498* | (2006.01) |
| *H01L 21/48* | (2006.01) |
| *H01L 21/683* | (2006.01) |
| *H01L 23/00* | (2006.01) |
| *H01L 23/31* | (2006.01) |

(52) U.S. Cl.
CPC ......... *H05K 1/0298* (2013.01); *H01L 21/486* (2013.01); *H01L 21/4857* (2013.01); *H01L 21/6835* (2013.01); *H01L 23/49822* (2013.01); *H01L 23/49838* (2013.01); *H01L 24/97* (2013.01); *H01L 23/3128* (2013.01); *H01L 24/16* (2013.01); *H01L 2221/68345* (2013.01); *H01L 2221/68359* (2013.01); *H01L 2224/16227* (2013.01)

(58) Field of Classification Search
CPC .... H05K 1/0296; H05K 1/0298; H05K 1/115; H05K 1/116
See application file for complete search history.

(56) References Cited

U.S. PATENT DOCUMENTS

| | | |
|---|---|---|
| 5,969,426 A | 10/1999 | Baba et al. |
| 6,071,755 A | 6/2000 | Baba et al. |
| 2003/0045024 A1 | 3/2003 | Shimoto et al. |

(Continued)

FOREIGN PATENT DOCUMENTS

| | | |
|---|---|---|
| JP | H08-167629 | 6/1996 |
| JP | 2002-151622 | 5/2002 |

(Continued)

*Primary Examiner* — Jeremy C Norris
(74) *Attorney, Agent, or Firm* — Rankin, Hill & Clark LLP

(57) ABSTRACT

A wiring board includes: a wiring structure including: a first insulating layer; a first wiring layer formed on a bottom surface of the first insulating layer; and a protective insulating layer which covers the bottom surface of the first insulating layer and has a first opening; and a support base member bonded to the protective insulating layer with an adhesive layer and has a second opening. A diameter of the second opening at a position between the top surface and the bottom surface of the support base member in a thickness direction of the support base member is smaller than a diameter of the second opening at the top surface of the support base member and a diameter of the second opening at the bottom surface of the support base member, and smaller than a diameter of the first opening.

10 Claims, 34 Drawing Sheets

(56) References Cited

U.S. PATENT DOCUMENTS

| | | |
|---|---|---|
| 2005/0088833 A1 | 4/2005 | Kikuchi et al. |
| 2005/0130413 A1 | 6/2005 | Shimoto et al. |
| 2018/0090426 A1 | 3/2018 | Sato et al. |

FOREIGN PATENT DOCUMENTS

| | | |
|---|---|---|
| JP | 2002-198462 | 7/2002 |
| JP | 2003-347459 | 12/2003 |
| JP | 2005-251780 | 9/2005 |
| JP | 2018-056361 | 4/2018 |

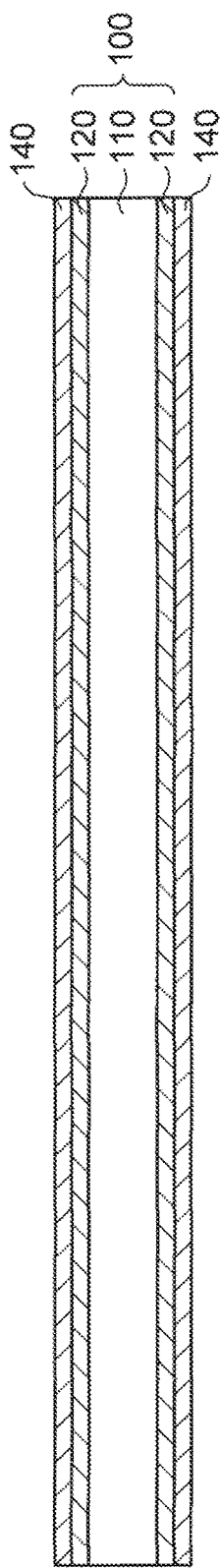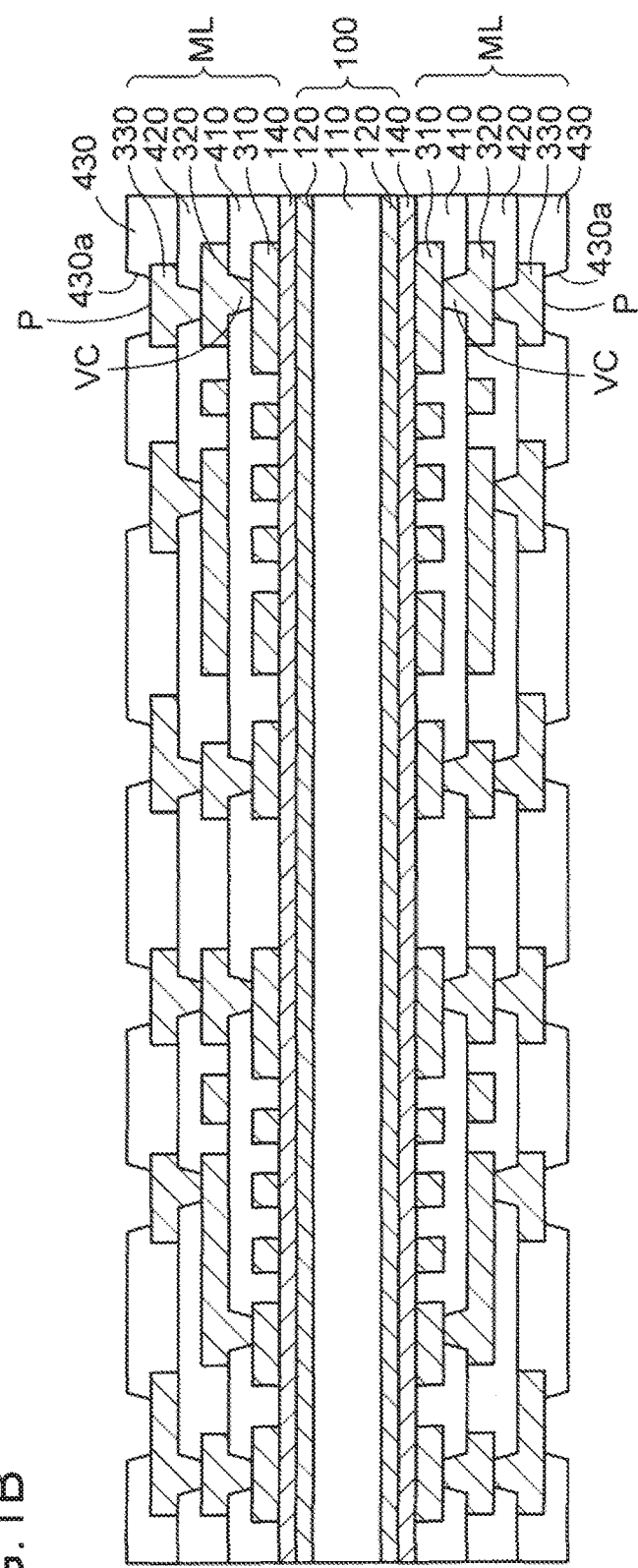

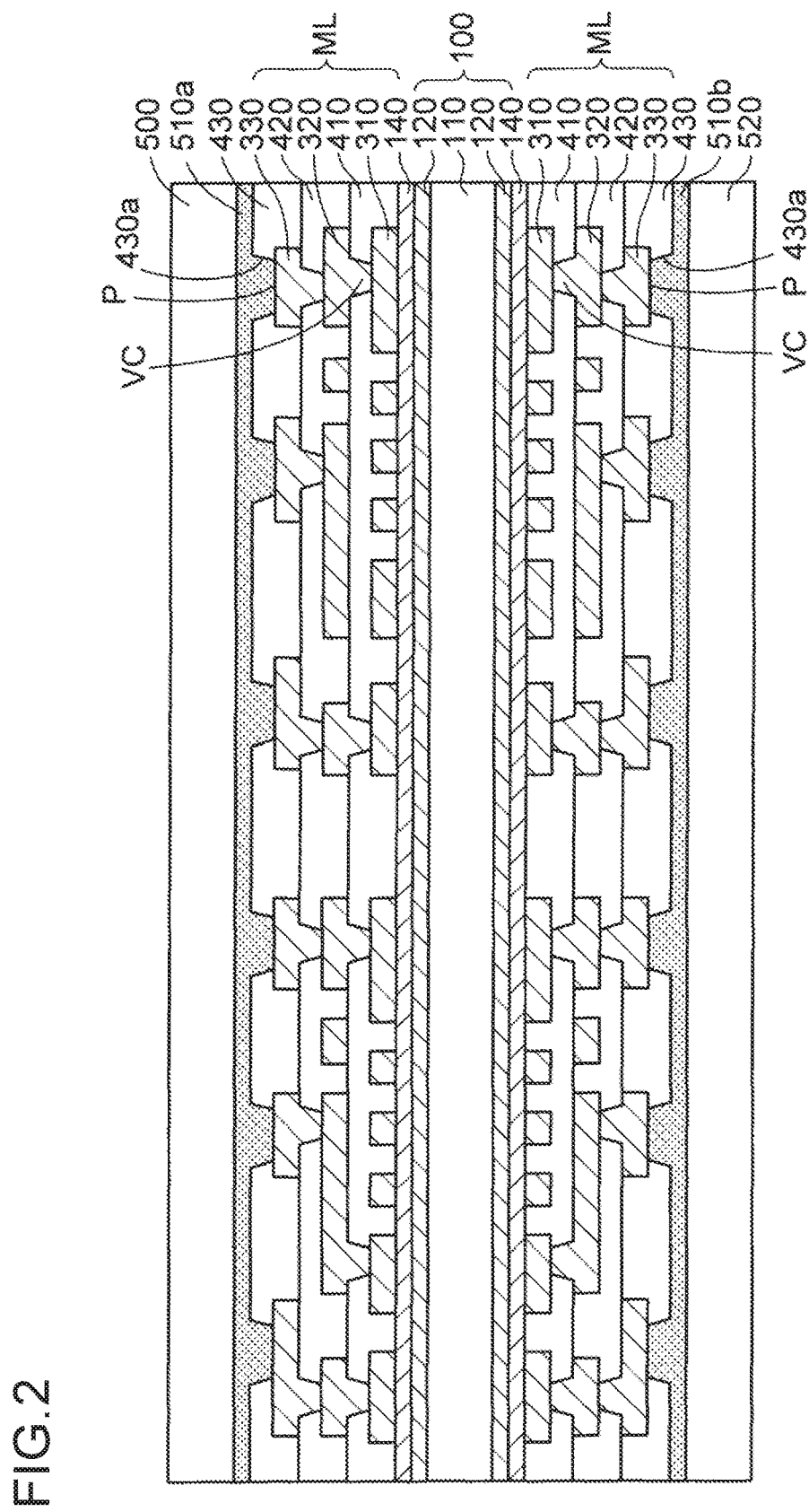

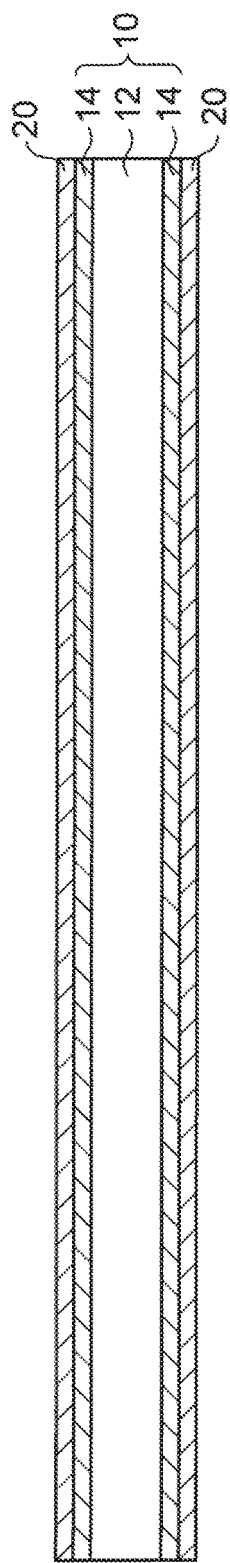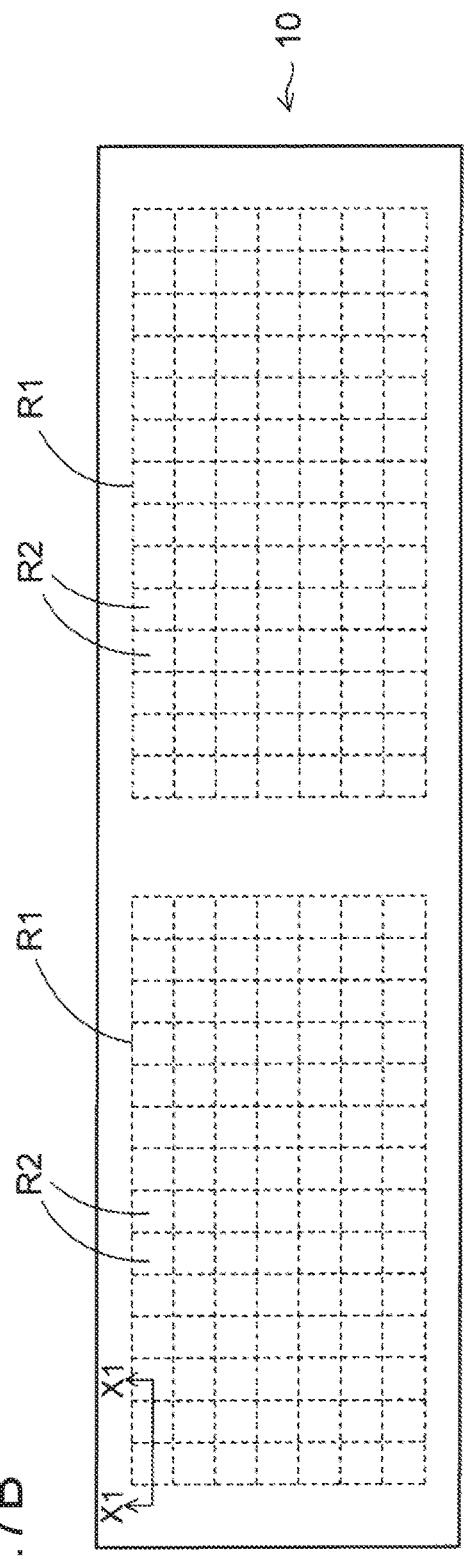

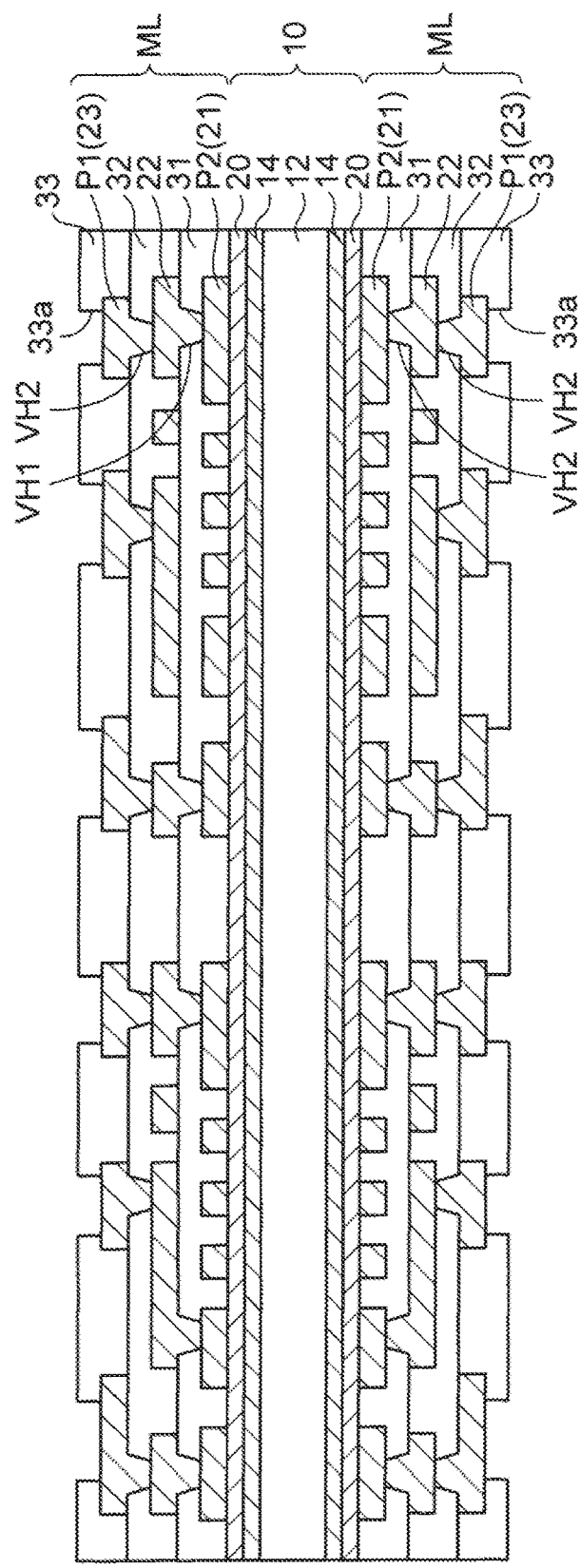

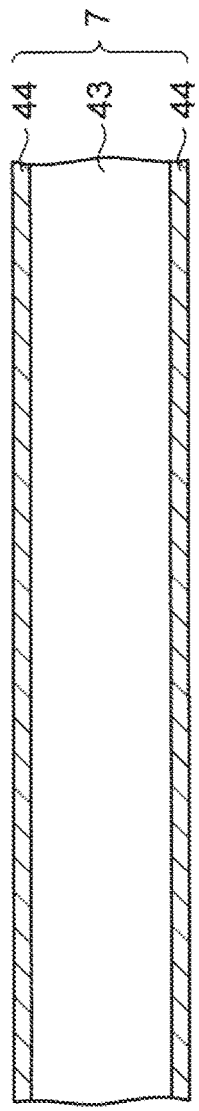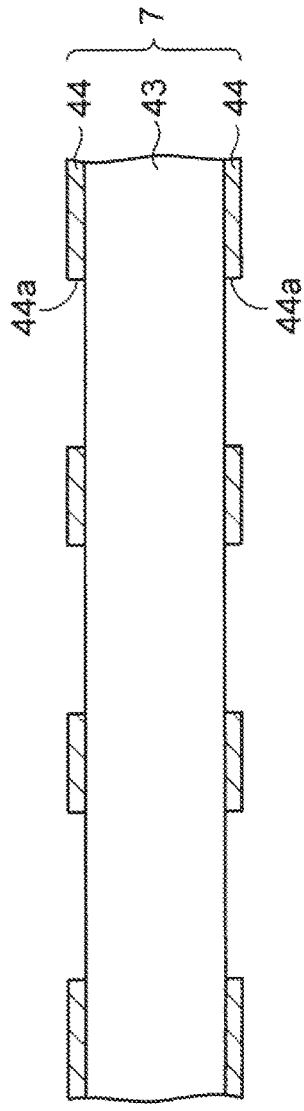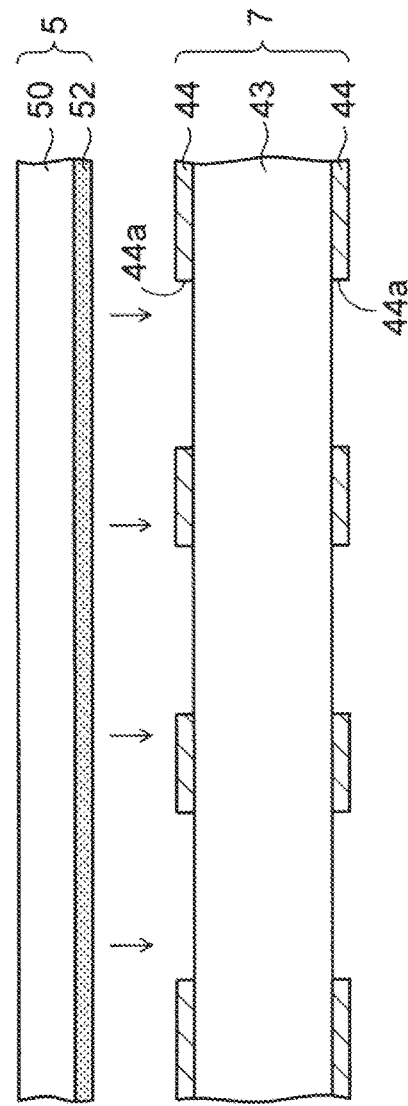
FIG. 10A
FIG. 10B
FIG. 10C

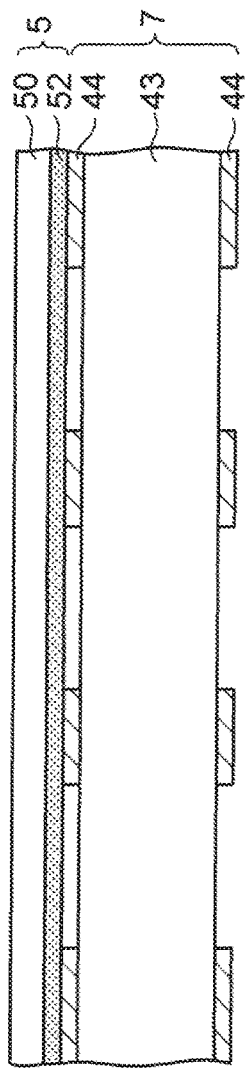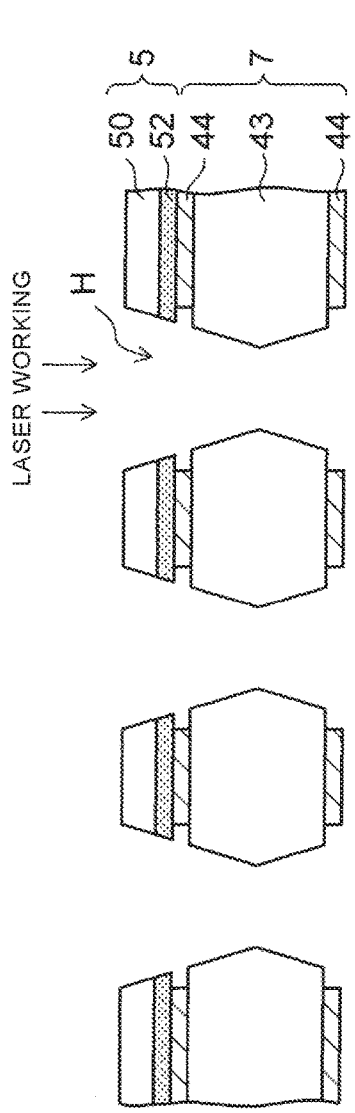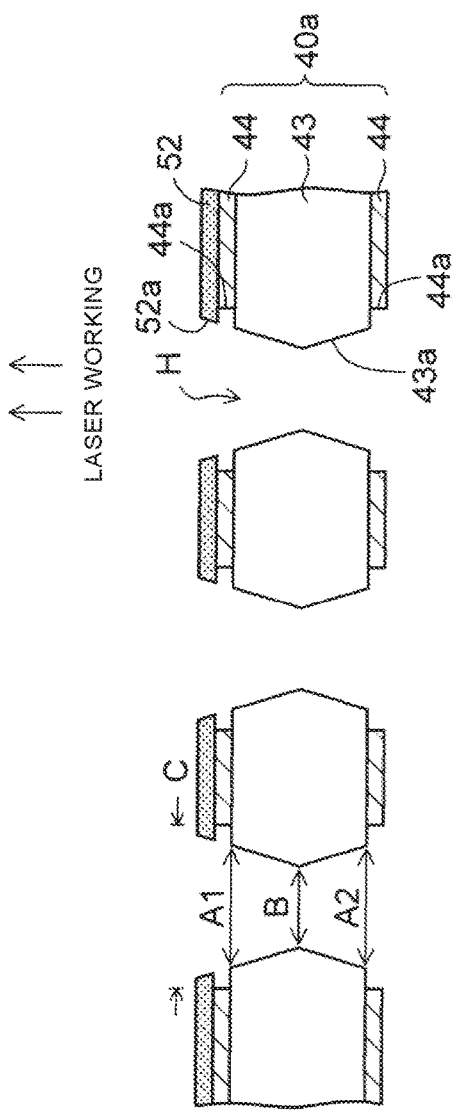

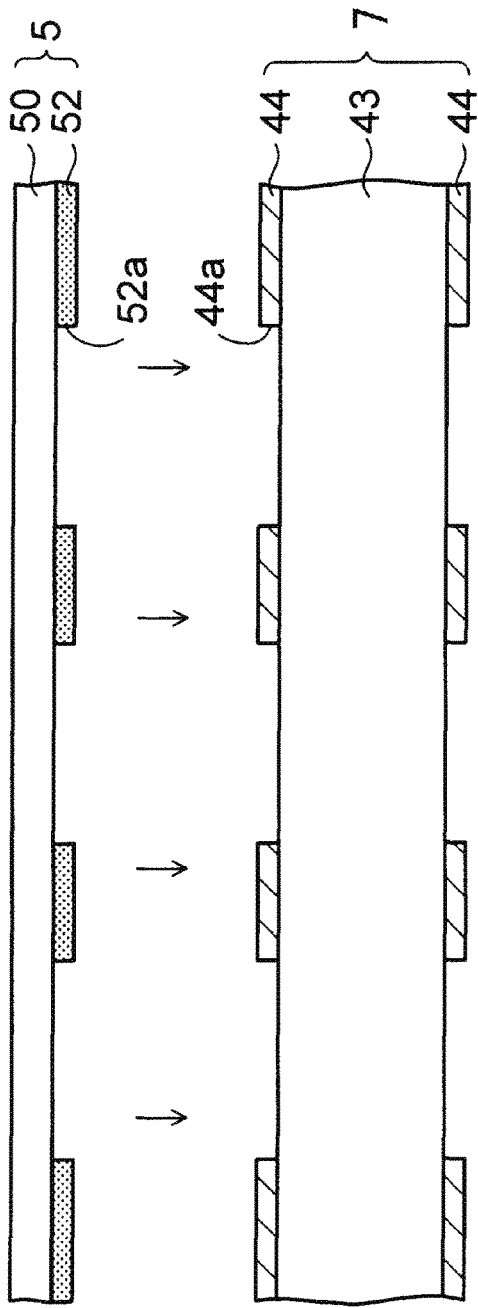
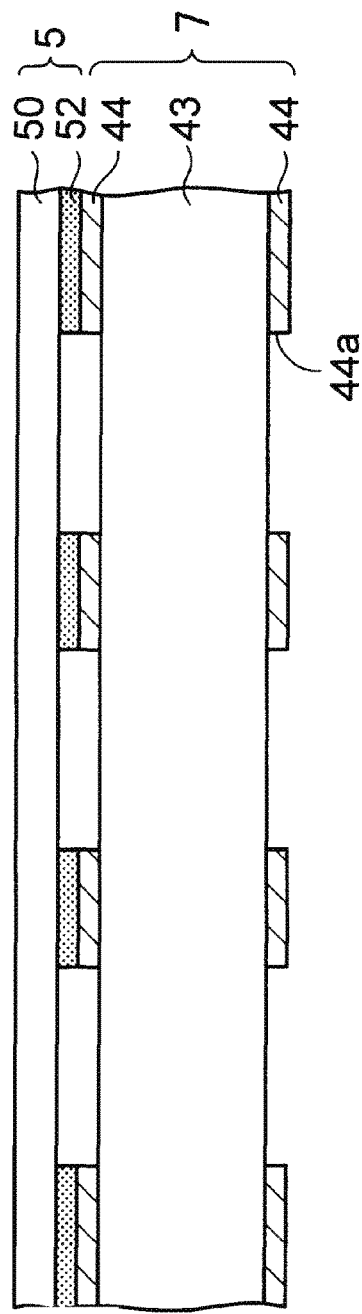
FIG. 13A
FIG. 13B

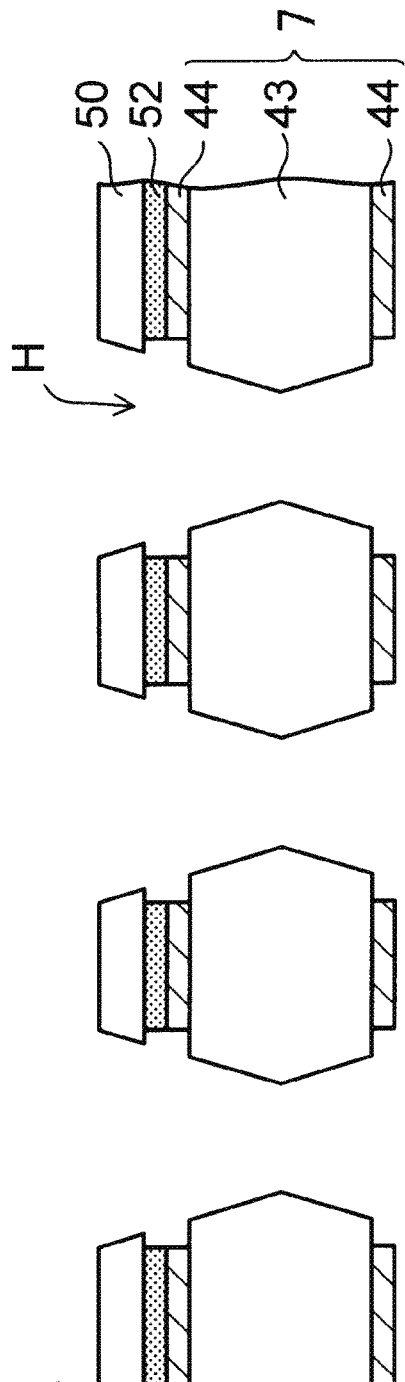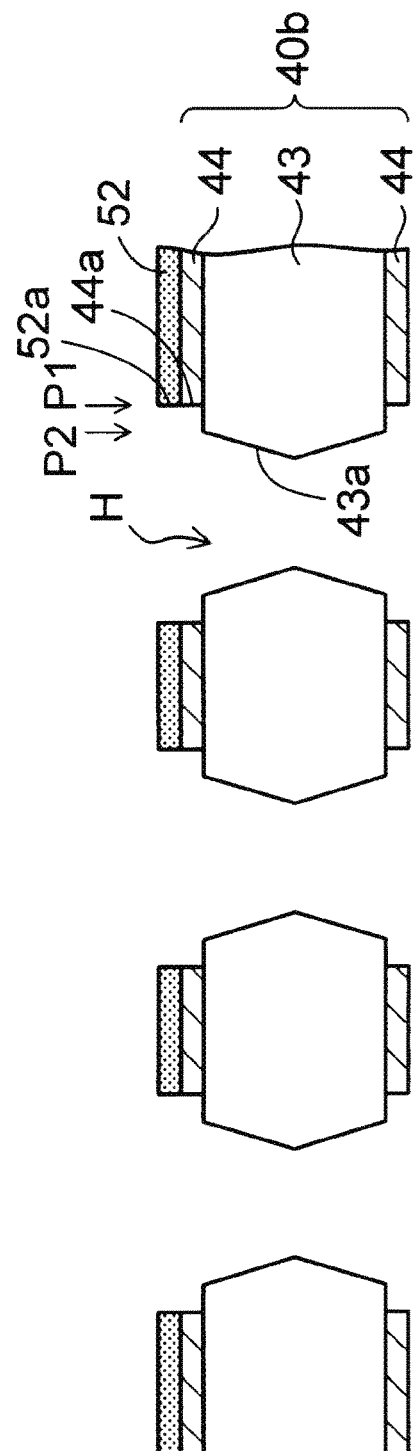

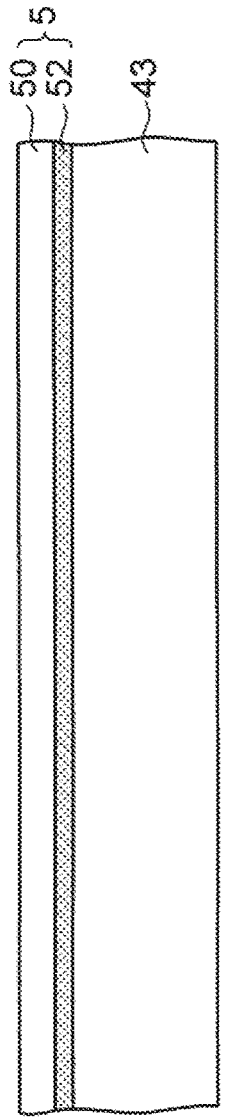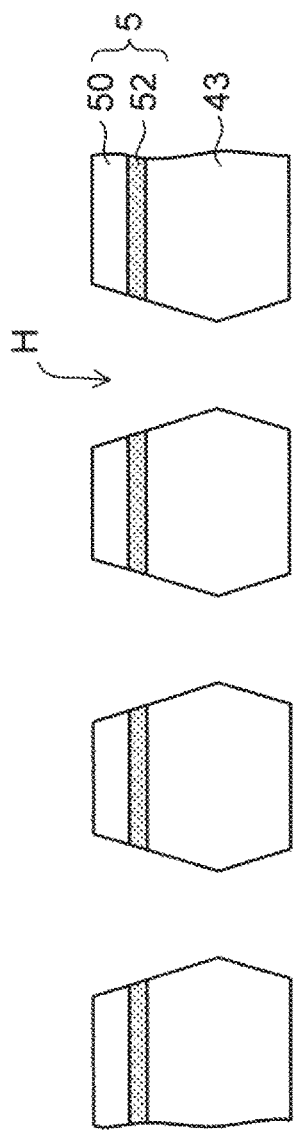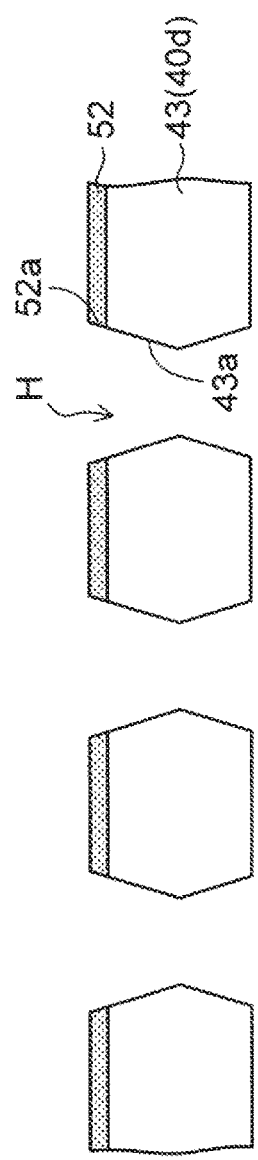

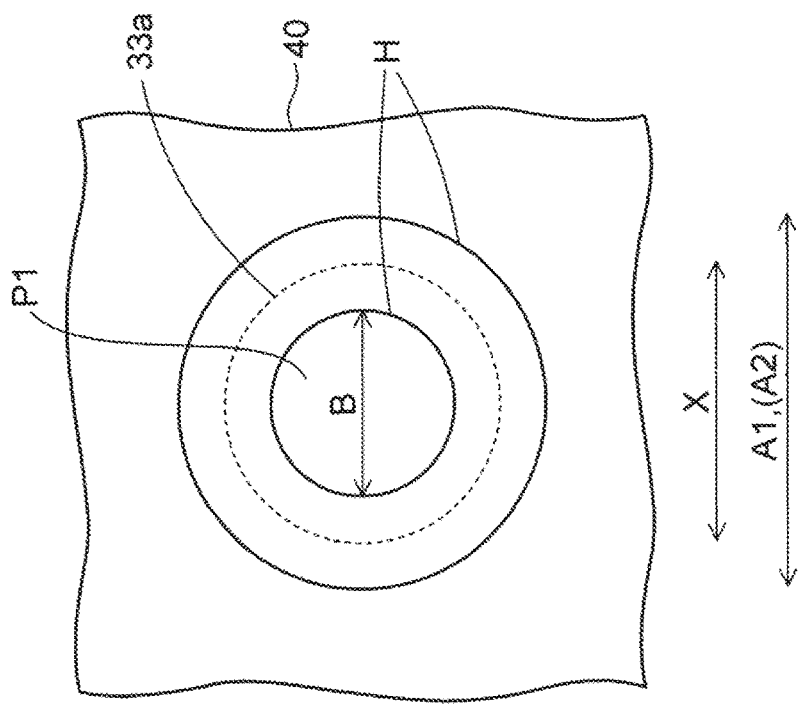
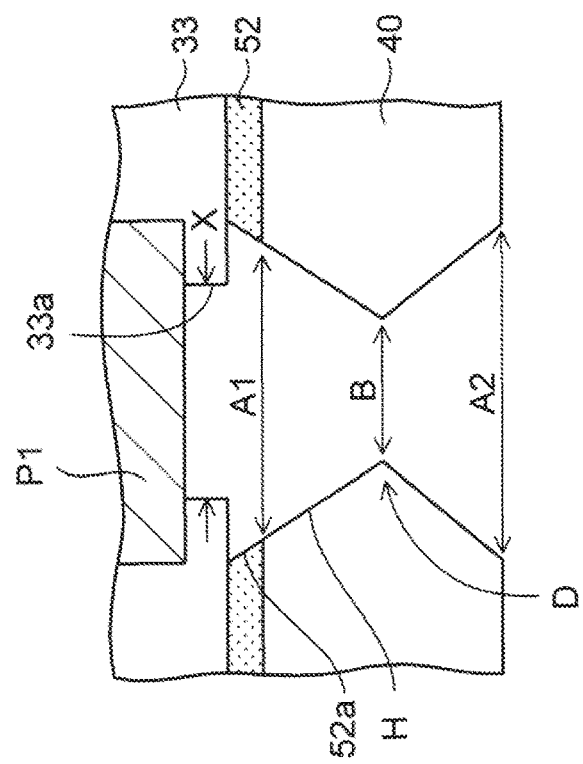
FIG.22A
FIG.22B

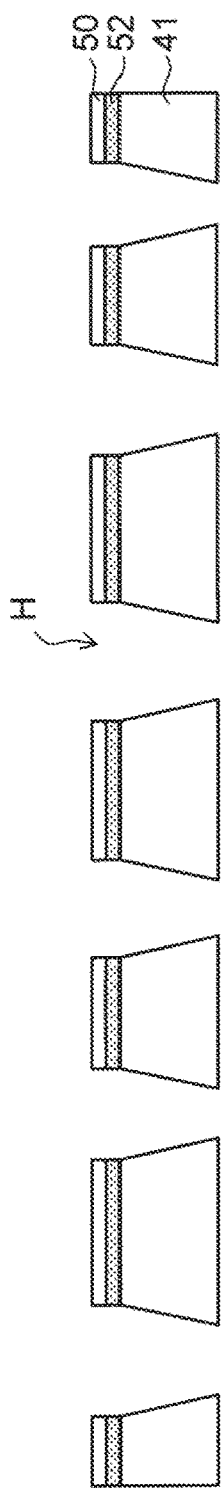
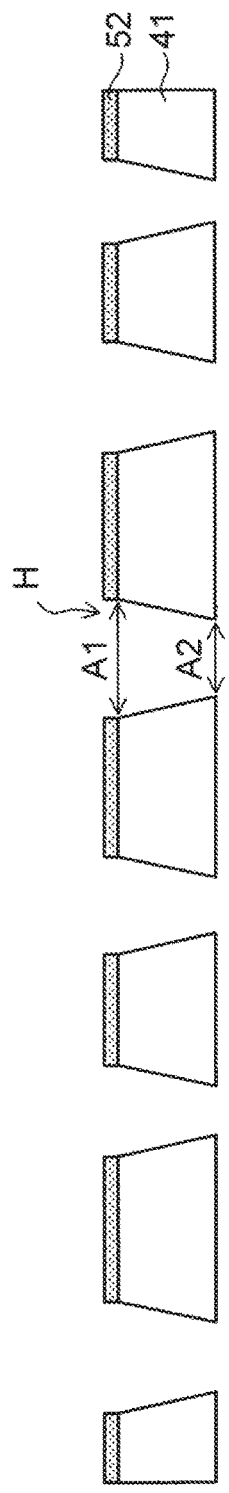

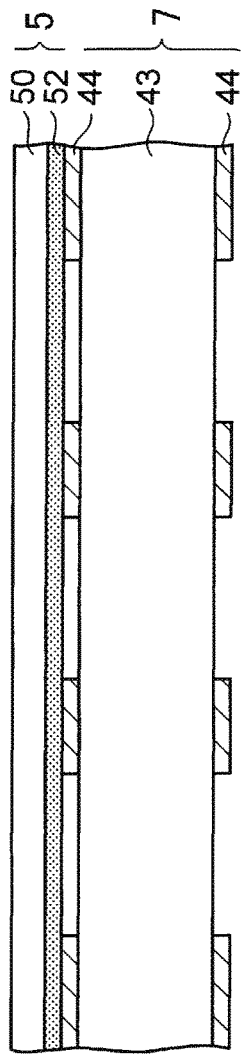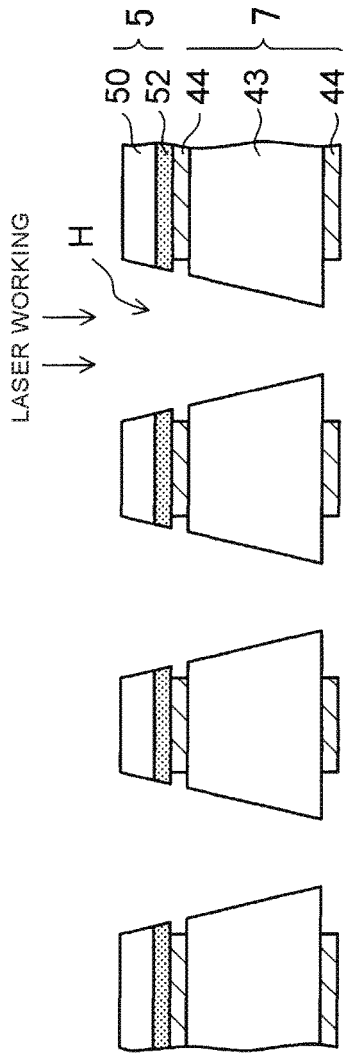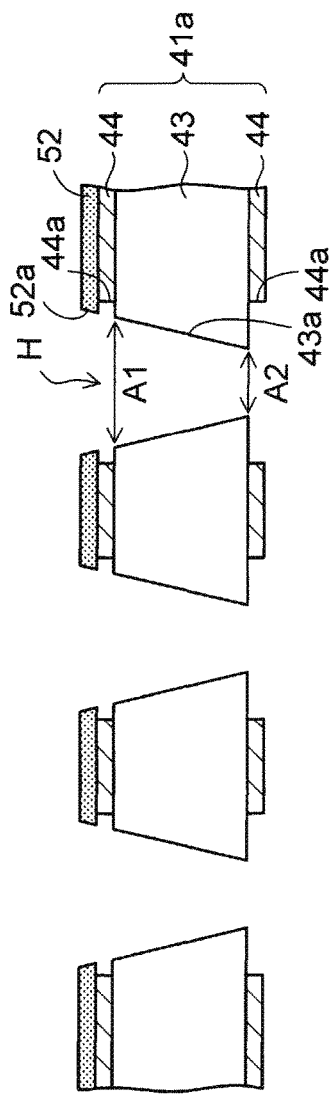

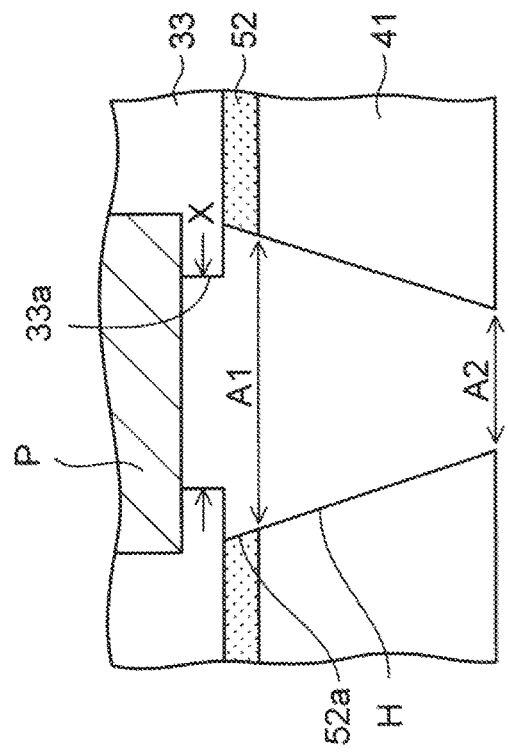
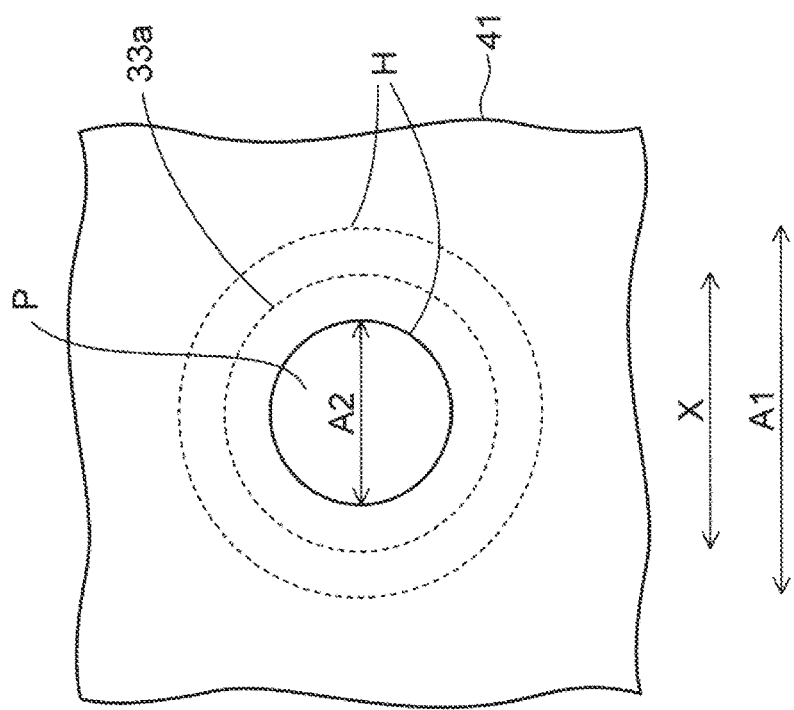
FIG.34A
FIG.34B ary items;

WIRING BOARD

This application claims priority from Japanese Patent Application No. 2017-236050 filed on Dec. 8, 2017, the entire contents of which are herein incorporated by reference.

BACKGROUND

1. Technical Field

The present disclosure relates to a wiring board.

2. Background Art

Wiring boards are known on which electronic components such as semiconductor chips are mounted. In such wiring boards, semiconductor chips are flip-chip-connected to pads formed on the top surface of the wiring board and solder bumps for external connection are formed on respective pads that are formed on the bottom surface of the wiring board (see JP-A-8-167629; JP-A-2002-151622; JP-A-2002-198462; and JP-A-2005-251780, for example).

As described later as part of preparatory items, in manufacturing methods of a coreless wiring board, a support base member is bonded to the outer surface of a multilayer wiring layer formed on a tentative substrate and then the multilayer wiring layer is separated from the tentative substrate. Subsequently, openings are formed through the support base member to expose pads of the multilayer wiring layer.

Where a technique of forming openings in the support base member by laser working is employed, oxide films that are formed on the surfaces of the pads due to heat generated during the laser working degrade the reliability of connection of solder bumps to the pads.

Where the openings of the support base member are set larger than openings, exposing the pads of the multilayer wiring layer, of a solder resist layer, portions, around the pads, of the solder resist layer are also removed by the laser working. This obstructs reliable formation of solder bumps.

SUMMARY

Certain embodiments provide a wiring board.
The wiring board comprises:
a wiring structure comprising:
  a first insulating layer;
  a first wiring layer formed on a bottom surface of the first insulating layer; and
  a protective insulating layer which covers the bottom surface of the first insulating layer and has a first opening that exposes a portion of the bottom surface of the first wiring layer, wherein the portion of the bottom surface of the first wiring layer, which is exposed through the first opening, serves as a first pad; and
a support base member which is bonded to the protective insulating layer with an adhesive layer and has a second opening that exposes the first pad, The support base member comprises a top surface on which the adhesive layer is formed and a bottom surface opposite to the top surface.

A diameter of the second opening at a position between the top surface and the bottom surface of the support base member in a thickness direction of the support base member is smaller than a diameter of the second opening at the top surface of the support base member and a diameter of the second opening at the bottom surface of the support base member, and smaller than a diameter of the first opening.

BRIEF DESCRIPTION OF THE DRAWINGS

FIGS. 1A and 1B are sectional views, that is, a first set of drawings, showing a manufacturing method of a wiring board relating to preparatory items;

FIG. 2 is a sectional view, that is, a second set of drawings, showing the manufacturing method of a wiring board relating to the preparatory items;

FIGS. 7A and 7B are sectional views, that is, a first set of drawings, showing a manufacturing method of a wiring board according to a first embodiment of the present invention;

FIG. 8 is a sectional view, that is, a second set of drawings, showing the manufacturing method of a wiring board according to the first embodiment;

FIGS. 10A-10C are sectional views, that is, a first set of drawings, showing a first forming method of a support base member of a first example;

FIGS. 11A-11C are sectional views, that is, a second set of drawings, showing the first forming method of the support base member of the first example;

FIGS. 13A and 13B are sectional views, that is, a first set of drawings, showing a forming method of a support base member of a second example;

FIGS. 14A and 14B are sectional views, that is, a second set of drawings, showing the first forming method of the support base member of the second example;

FIGS. 16A-16C are sectional views showing a forming method of a support base member of a fourth example;

FIGS. 22A and 22B are a partial enlarged sectional view and a partial enlarged plan view, respectively, showing one opening and its neighborhood of the wiring board shown in FIG. 21;

FIGS. 28A and 28B are sectional views showing a support base member to be used for producing a wiring board according to a second embodiment;

FIGS. 29A-29C are sectional views showing a first forming method of a support base member of a first example to be used for producing the wiring board according to the second embodiment;

FIGS. 34A and 34B are a partial enlarged sectional view and a partial enlarged plan view, respectively, showing one opening and its neighborhood of the wiring board shown in FIG. 33.

DETAILED DESCRIPTION

Figure 3:
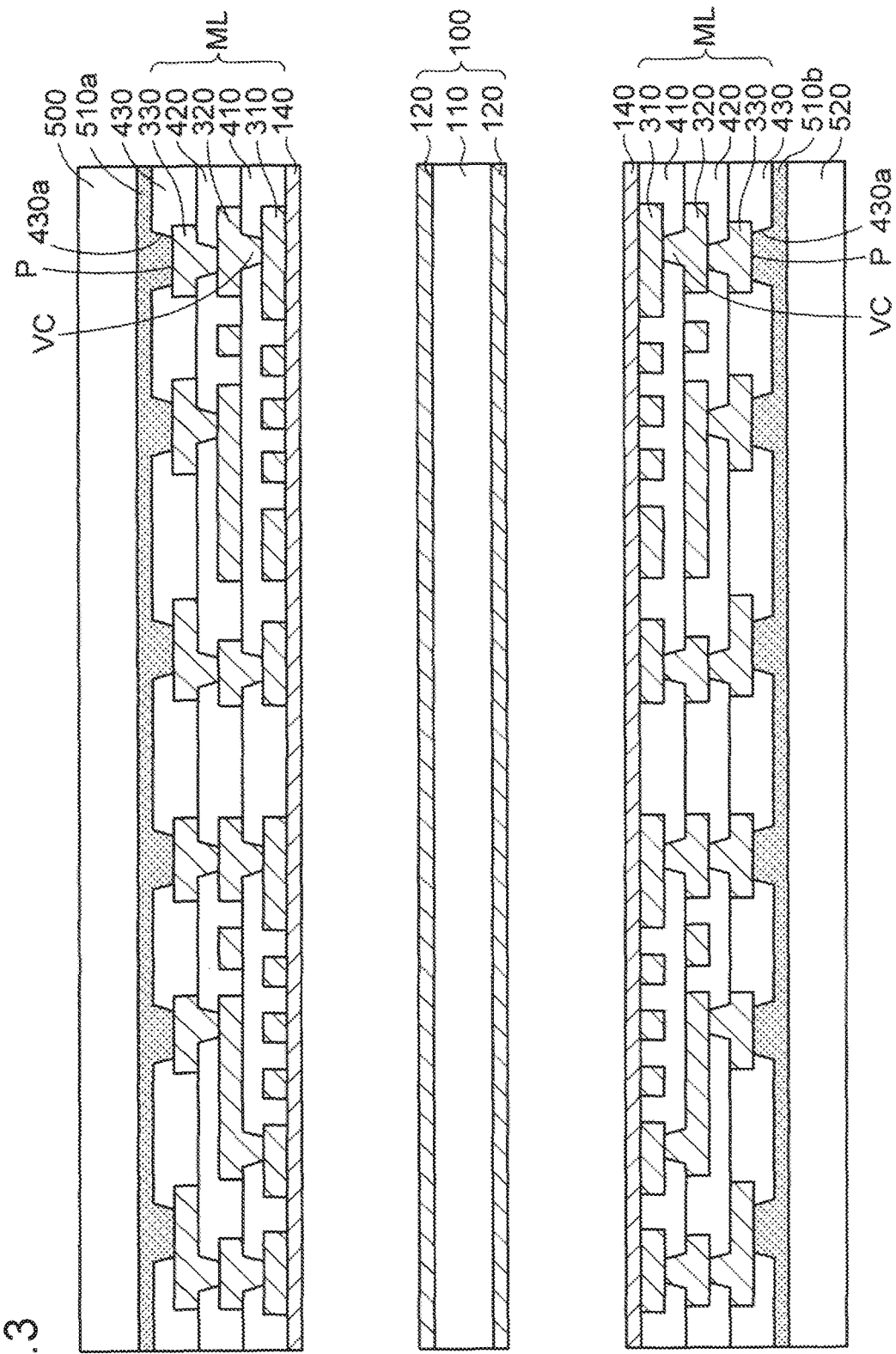
FIG. 3 is sectional views, that is, a third set of drawings, showing the manufacturing method of a wiring board relating to the preparatory items.

Embodiments of the present invention will be hereinafter described with reference to the accompanying drawings.

Before the description of the embodiments, preparatory items will be described as a base of the embodiments. The preparatory items are items that are based on personal studies of the inventor and include novel techniques, that is, techniques that are not known in the art.

FIGS. 1A and 1B to FIGS. 6A-6C are views for description of problems of a manufacturing method of a wiring board relating to the preparatory items. In the manufacturing method of a wiring board relating to the preparatory items, first, as shown in FIG. 1A, a tentative substrate 100 is prepared in which adhesive layers 120 are adhered to the two respective surfaces of a resin sheet 110.

Metal layers 140 are then formed on the two respective adhesive layers 120 formed on the two surfaces of the tentative substrate 100. The metal layers 140 serve as seed layers when wiring layers are formed by electrolytic plating. For example, each adhesive layer 120 can be a metal foil such as a copper foil, an aluminum foil, a nickel foil, or a zinc foil or a resin sheet that is mainly made of a resin such as an acrylic resin or a polyimide resin.

For example, each metal layer 140 can be made of copper (Cu) or nickel (Ni). Where each metal layer 140 is made of nickel (Ni), a copper (Cu) layer may be formed on it additionally to improve adhesion to a wiring layer.

Then, as shown in FIG. 1B, a multilayer wiring layer ML is formed on each of the metal layers 140 formed on the two respective surfaces of the tentative substrate 100. In each multilayer wiring layer ML, three wiring layers 310, 320, 330 are connected to each other by via conductors VC that are formed through insulating layers 410 and 420 and a solder resist layer 430 is formed as an outermost layer. Openings 430a are formed through the solder resist layer 430 over respective pads P of the outermost wiring layer 330.

Then, as shown in FIG. 2, a support base member 500 is bonded to the top-side solder resist layer 430 and the pads P of the laminated body shown in FIG. 1B with an adhesive layer 510a. Likewise, a support base member 520 is bonded to the bottom-side solder resist layer 430 and the pads P of the laminated body shown in FIG. 1B with an adhesive layer 510b.

Then, as shown in FIG. 3, the metal layers 140 are peeled off the respective adhesive layers 120, located on the two respective sides, of the tentative substrate 100, whereby the top and bottom multilayer wiring layers ML are separated from the tentative substrate 100. In the multilayer wiring layer ML separated from the bottom surface of the tentative substrate 100, the metal layer 140 is left on the wiring layer 310 and the insulating layer 410.

Figure 4:
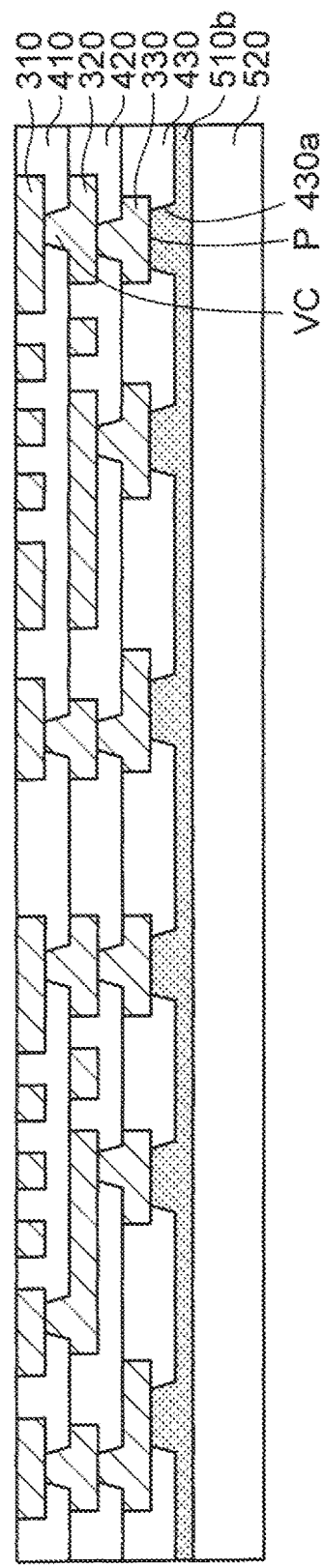
FIG. 4 is a sectional view, that is, a fourth set of drawings, showing the manufacturing method of a wiring board relating to the preparatory items.

Subsequently, as shown in FIG. 4, the metal layer 140 is removed from the multilayer wiring layer ML by wet etching. As a result, the wiring layer 310 is exposed from the top insulating layer 410 of the multilayer wiring layer ML.

Figure 5:
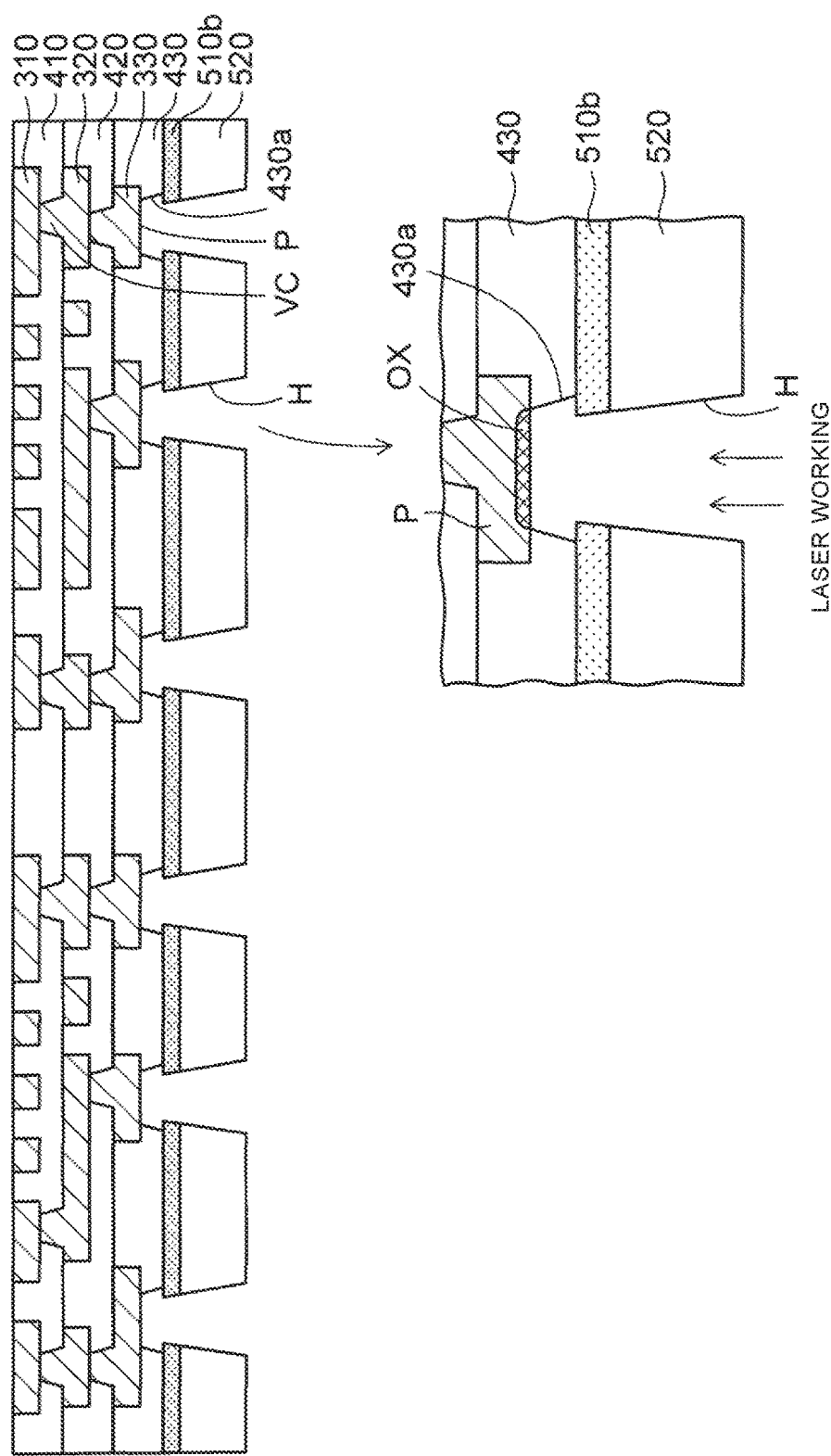
FIG. 5 is a sectional view, that is, a fifth set of drawings, showing the manufacturing method of a wiring board relating to the preparatory items.

Then, as shown in FIG. 5, openings H are formed to face the respective pads P using laser light so as to penetrate through the support base member 520 and the adhesive layer 510b. The quality of individual product regions is judged by performing an electrical test by bringing probe pins (not shown) of an electrical characteristics measuring instrument into contact with the pads P of the multilayer wiring layer ML.

As shown in an inset (partial enlarged sectional view) in FIG. 5, in forming openings H by laser working, the pads P of the multilayer wiring layer ML are irradiated with laser light. As a result, each pad P is changed in quality by heat that is generated by the irradiation with laser light and an oxide film OX is formed in the surface of the pad P, degrading the reliability of connection of a solder bump to the pad P.

Where each opening H is set wider than the associated opening 430a of the solder resist layer 430, a portion, around the pad P, of the solder resist layer 430 is also removed by laser light. Thus, the size of the opening 430a of the solder resist layer 430 is made larger than a designed size.

Figure 6C:
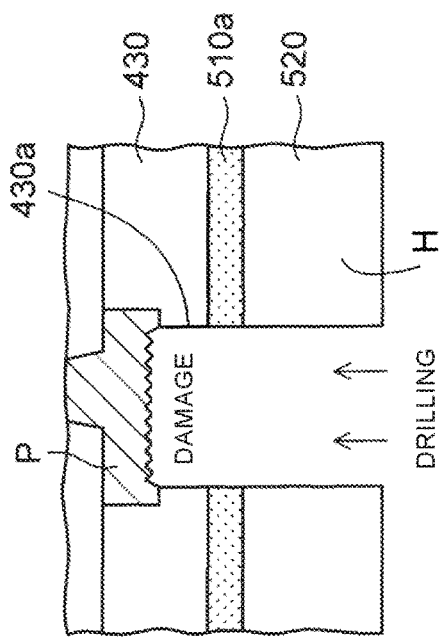
FIGS. 6A-6C are sectional views, that is, a sixth set of drawings, showing the manufacturing method of a wiring board relating to the preparatory items.
Figure 6A:
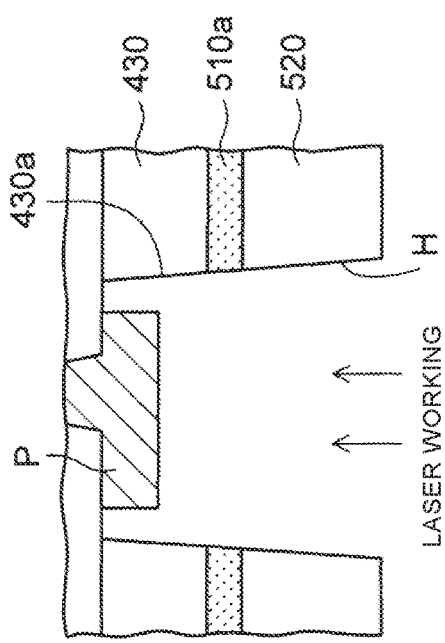
Figure 6B:
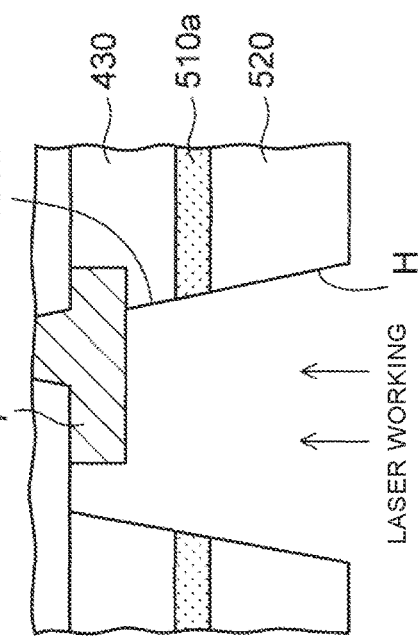

If as shown in FIG. 6B the opening H is deviated from the pad P in the case shown in FIG. 6A, the opening 430a of the solder resist layer 430 is formed so as not to be symmetrical with respect to the pad P.

As a result, when a solder bump is formed by forming a solder ball in the opening 430a of the solder resist layer 430 and subjecting it to reflow processing, the solder also flows in the lateral direction and may cause a shape failure of a resulting solder bump.

More specifically, the height of solder bumps becomes lower than a designed value or varies, as a result of which the height of the solder bumps is not made constant in the wiring board. This degrades the reliability of connection of the solder bumps to a mounting board.

FIG. 6C shows a case that openings H are formed by drilling rather than laser working. In this case, the surface of each pad P may be damaged by drilling. This degrades the reliability of connection of solder bumps to the pads P.

The above problems can be solved by wiring boards and manufacturing methods thereof according to the embodiments described below.

Embodiment 1

Figure 23:
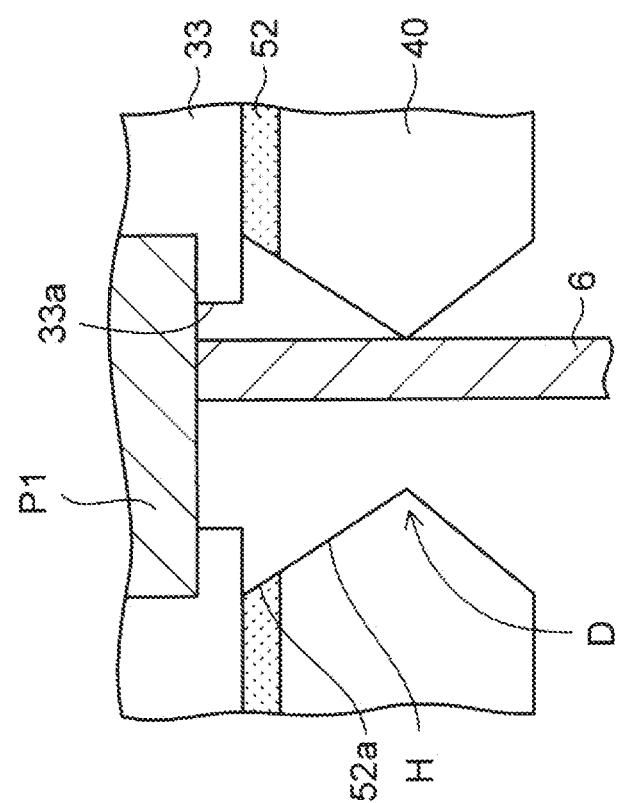
FIG. 23 is a partial enlarged sectional view showing how a probe pin is brought into contact with a pad through the opening shown in FIG. 22A.

FIGS. 7A and 7B to FIG. 20 are views for description of a manufacturing method of a wiring board according to a first embodiment of the invention. FIG. 21-23 are views for description of a wiring board according to the first embodiment. FIGS. 24-27 are views for description of an electronic component device that employs the wiring board shown in FIG. 21.

The configuration of the wiring board according to the first embodiment will be described below together with its manufacturing method.

In the manufacturing method of a wiring board according to the first embodiment, first, a tentative substrate 10 is prepared as shown in FIG. 7A. In the example of FIG. 7A, the tentative substrate 10 in which adhesive layers 14 are formed on the two respective surfaces of a resin sheet 12 is prepared. For example, the resin sheet 12 is a resin base member in which an epoxy resin is impregnated in a glass cloth.

Each adhesive layer 14 can be a metal foil such as a copper foil, an aluminum foil, a nickel foil, or a zinc foil or a resin sheet that is mainly made of a resin such as an acrylic resin or a polyimide resin.

Metal layers 20 are then formed on the two respective adhesive layers 14 formed on the two surfaces of the tentative substrate 10. The metal layers 20 are formed by electrolytic plating using the adhesive layers 14 as plating power supply paths, sputtering, or electroless plating. The metal layers 20 serve as seed layers when wiring layers are formed by electrolytic plating.

For example, each metal layer 20 can be made of copper (Cu) or nickel (Ni). In the case of using a metal layer 20 made of nickel (Ni), a copper (Cu) layer may be formed on the metal layer 20 to improve adhesion to a wiring layer.

As shown in FIG. 7B, the tentative substrate 10 is sectioned into plural block regions R1 and, furthermore, each block region R1 is sectioned into plural product regions R2. FIG. 7A is a sectional view taken along line X1-X1 in FIG. 7B and shows part of one product region R2 in one block region R1 shown in FIG. 7B.

Then, as shown in FIG. 8, first, a wiring layer 21 is formed on each metal layer 20. The wiring layer 21 can be formed by any of various wiring forming methods such as a semi-additive method. For example, a resist layer having openings at desired positions is formed on the surface of the metal layer 20.

The openings are formed so as to expose portions, where to form a wiring layer 21, of the resist layer. The resist layer is made of a photosensitive dry film resist or a liquid photoresist; for example, a dry film resist or a liquid resist made of a novolac resin or an acrylic resin can be used.

A wiring layer 21 is formed on the surface of the metal layer 20 by performing electrolytic plating (electrolytic copper plating) using the resist layer and the metal layer 20 as a plating mask and a plating power supply layer, respectively. Then the resist layer is removed by an alkaline peeling liquid, for example.

An insulating layer 31 is thereafter formed by laminating an insulative resin film made of, for example, a thermosetting epoxy resin so as to cover the wiring layer 21 which is formed on the metal layer 20. The material of the insulating layer 31 is not limited to a thermosetting resin and may be a photosensitive resin, for example. In the manufacturing method according to the embodiment, a thermosetting resin is used. The insulating layer 31 may be formed by applying an insulative resin such as a liquid or paste-like thermosetting epoxy resin and setting it.

Via holes VH1 are then formed through the insulating layer 31 so as to penetrate through the insulating layer 31 and expose portions of the wiring layer 21. The via holes VH1 can be formed by laser working using a CO2 laser, for example. Desmear treatment may be performed if necessary.

A wiring layer 22 is then formed by a semi-additive method, for example. For example, first, a seed layer is formed on the top surface of the insulating layer 31 by, for example, electroless plating. A resist layer having openings at prescribed positions is formed on the seed layer.

As in the above-described case, the resist layer is made of a photosensitive dry film resist or a liquid photoresist; for example, a dry film resist or a liquid resist made of a novolac resin or an acrylic resin can be used.

An electrolytic plating layer is formed by performing electrolytic plating (electrolytic copper plating) using the resist layer and the seed layer as a plating mask and a plating power supply layer, respectively. After the resist layer is removed using, for example, an alkaline peeling liquid, unnecessary portions of the seed layer are removed using the electrolytic plating layer as an etching mask. A wiring layer 22 is thus formed.

Subsequently, the same step as the above-described step of forming the insulating layer 31 and the same step as the above-described step of forming the wiring layer 22 are repeatedly performed, whereby an insulating layer 32 and a wiring layer 23 are formed. A wiring structure is forming by laying a prescribed number of sets of a wiring layer and an insulating layer one on another.

A solder resist layer 33 (protective insulating layer) having openings 33a are thereafter formed on the top surfaces of the wiring layer 23 and the insulating layer 32.

For example, the solder resist layer 33 is formed by laminating a photosensitive resin film or applying a liquid or paste-like resin and patterning the resin (film) into a desired shape by exposing it to light and develop an exposed film by photolithography. A multilayer wiring layer ML (an example of a wiring structure) is thus formed in which portions of the top surface of the wiring layer 23 are exposed as pads P1 through the openings 33a of the solder resist layer 33. The multilayer wiring layer ML as an example wiring structure may consist of one wiring layer and one insulating layer.

Figures 9A, 9B:
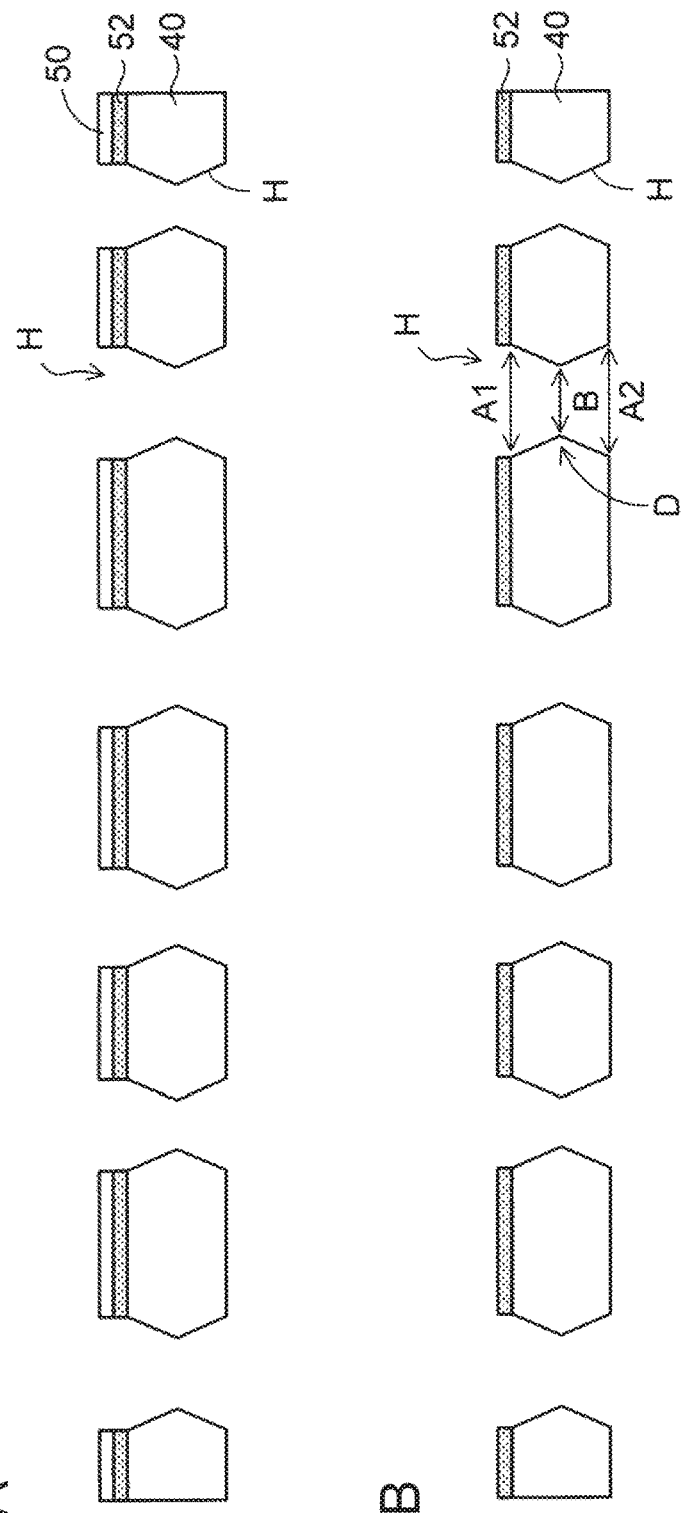
FIGS. 9A and 9B are sectional views showing a support base member to be used for producing a wiring board according to the first embodiment.

Next, a support base member 40 to be bonded to the outer surface of each multilayer wiring layer ML shown in FIG. 8 will be described. As shown in FIG. 9A, the support base member 40 is an insulative base member and an adhesive layer 52 and a peeling film 50 are formed in this order on one surface of the insulative base member. The support base member 40 is a general version of support base members 40a-40d of first to fourth examples (described later). The support base member 40 has a top surface on which the adhesive layer 52 is formed and a bottom that is opposite to the top surface.

Openings H are formed so as to penetrate through the peeling film 50, the adhesive layer 52, and the support base member 40 (from the top surface of the peeling film 50 to the bottom surface of the support base member 40). The openings H serve as probe measurement holes through which probe pins (not shown) of an electrical characteristics measuring instrument are to pass and be brought into contact with the respective pads P1 of the multilayer wiring layer ML to perform an electrical test.

In bonding the support base member 40 to the multilayer wiring layer ML, as shown in FIG. 9B, the peeling film 50 is peeled off to expose the adhesive layer 52. A support base member 40 with an adhesive layer 52 is thus obtained.

The support base member 40 is formed with ring-shaped projections D which project inward from the inner walls of the openings H, respectively, at a halfway (middle) position in their height direction.

That is, in each opening H, the diameter B at the halfway (middle) position in its height direction is set smaller than the diameter A1 at the top and the diameter A2 at the bottom. The diameter of each opening H decreases as the position goes from the top end to the middle position, and increases as the position goes from the middle position to the bottom end.

Thus, the support base member 40 is prepared in which the adhesive layer 52 is located on its one surface. The openings H are formed through the support base member 40 in advance, that is, before the support base member 40 is bonded to the multilayer wiring layer ML.

Next, preferable, specific examples (first to fourth examples) of the support base member 40 will be described. First, a support base member 40a of a first example will be described. In a first forming method of the support base member 40a of the first example, first, as shown in FIG. 10A, a metal-laminated plate 7 is prepared in which metal layers 44 are bonded to the two respective surfaces of a resin sheet 43.

In the support base member 40a of the first example, the resin sheet 43 is used as an insulative base material. The metal layers 44 can be copper foils, for example.

Then, as shown in FIG. 10B, openings 44a are formed through the metal layers 44 located on the two respective sides by patterning it by photolithography and wet etching. The openings 44a of the metal layers 44 are formed so as to have a size that is one-size larger than the size of openings H to be obtained finally (i.e., the diameter A1 of the top end of each opening H). The metal layers 44 in which the openings 44a have been formed are then blackened.

Then, as shown in FIG. 10C, an adhesive layer 5 with a peeling film is prepared. The adhesive layer 5 with a peeling film is formed of a peeling film 50 and an adhesive layer 52 which is bonded to one surface of the peeling film 50 tentatively. Then, as shown in FIG. 11A, the surface of the adhesive layer 52 of the adhesive layer 5 with a peeling film is bonded to the metal-laminated plate 7.

Subsequently, as shown in FIG. 11B, laser working is performed from both sides on the metal-laminated plate 7 to which the adhesive layer 5 with a peeling film is bonded, whereby through-holes are formed to penetrate through the bonded structure (from the top surface of the peeling film 50 to the bottom surface of the resin sheet 43).

In this working, portions, corresponding to the openings 44a of the metal layers 44, of the adhesive layer 5 with a peeling film and the resin sheet 43 are removed. The portions thus removed of the resin sheet 43 are one-size smaller than the openings 44a of the metal layers 44.

Openings H are formed in such a manner that through-holes are formed through the resin sheet 43 of the metal-laminated plate 7 when the surface being worked from the top side of the metal-laminated plate 7 and the surface being worked from its bottom side join to each other.

Then, as shown in FIG. 11C, the peeling film 50 is peeled off the laminated body shown in FIG. 11B. The adhesive layer 52 remains on the top metal layer 44 formed on the resin sheet 43. The diameter of the opening 52a of the adhesive layer 52 is set to be smaller than that of the opening 42a of the top metal layer 44.

The laser working may be performed from both sides of the metal-laminated plate 7 at the same time. Alternatively, through-holes may be formed by first performing laser working from one side of the metal-laminated plate 7 until holes reach a halfway position of the resin sheet 43 in its thickness direction and then performing laser working from the other side.

With the above-described process, a support base member 40a (with an adhesive layer 52) of the first example is obtained. The support base member 40a of the first example includes the resin sheet 43 and the metal layers 44 formed on the two respective surfaces of the resin sheet 43. The adhesive layer 52 is bonded to the top metal layer 44.

The openings H are formed such that the openings 44a of the metal layers 44 located on the two respective sides are connected to through-holes 43a of the resin sheet 43.

A hole formed by laser working as in the step shown in FIG. 11B decreases in diameter as the position goes deeper. Thus, as shown in FIG. 11C, the openings H (the through-holes 43a of the resin sheet 43) are formed such that the diameter B at the halfway (middle) position in its height direction is smaller than the diameter A1 at the top and the diameter A2 at the bottom.

Furthermore, as described above, the diameter of the openings 44a of the metal layers 44 is set one-size larger than the top diameter A1 of the openings H. Thus, as shown in FIG. 11C, the diameter C of the openings 44a of the metal layers 44 is set larger than the top diameter A1 and the bottom diameter A2 of the openings 43a of the resin sheet 43.

As described above, the inner walls of each pair of openings 44a of the top and bottom metal layers 44 are located outside (stand back from) the top end and the bottom end of the associated through-hole 43a of the resin sheet 43, respectively.

As a result, as described later, when an electrical measurement is performed by bringing probe pins of an electrical characteristics measuring instrument into contact with the pads P1 of the above-described multilayer wiring layer ML shown in FIG. 8 through the openings H of the support base member 40a of the first example, there is no risk that the probe pins come into contact with the metal layers 44.

Inner wall portions, adjacent to the openings 52a, of the adhesive layer 52 are heated during laser working and thereby not only contract and recede but also are hardened thermally to lose flowability. Thus, when as described later the support base member 40a shown in FIG. 11C is bonded to the multilayer wiring layer ML shown in FIG. 8 with the adhesive layer 52, it can be prevented that parts of the adhesive layer 52 flow onto the pads P1.

Furthermore, spaces are formed under inner wall portions, adjacent to the openings 52a, of the adhesive layer 52 because the ends of the metal layer 44 stand back outward. Thus, even if parts of the adhesive layer 52 flow out, they flow into those spaces and stay there; they are not prone to flow onto the pads P1.

Figure 12A:
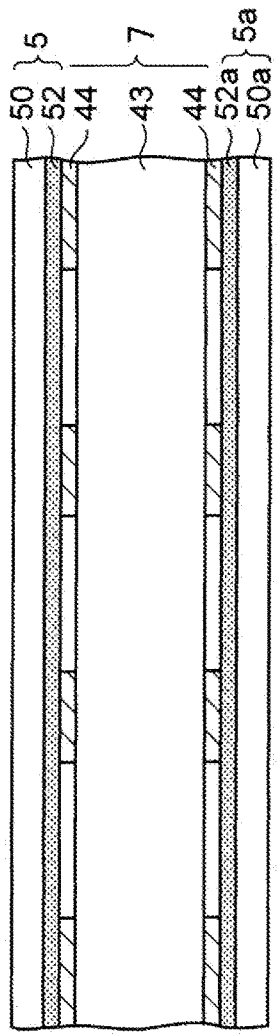
FIGS. 12A-12C are sectional views showing a second forming method of the support base member of the first example.

Next, a second forming method of the support base member 40a of the first example will be described. As shown in FIG. 12A, an adhesive layer 5a with a peeling film is also bonded to the bottom surface of the metal-laminated plate 7 shown in FIG. 11A. That is, peeling films 50 and 50a are bonded to the two surfaces of the metal-laminated plate 7 with the adhesive layers 52 and 52b, respectively.

Figure 12B:
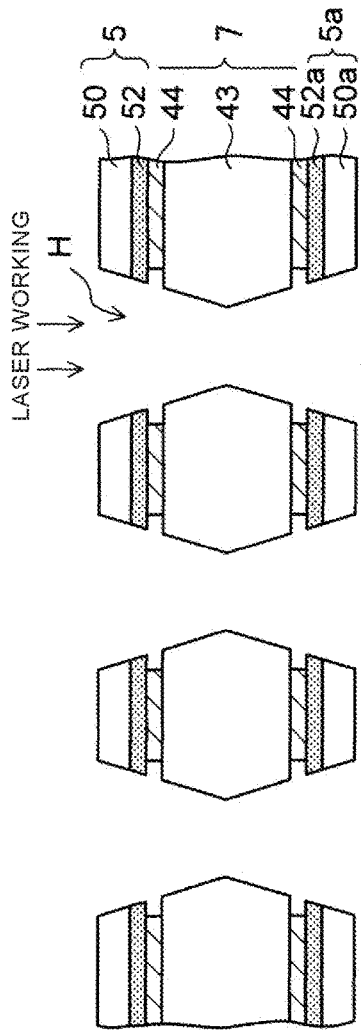

Then, as shown in FIG. 12B, laser working is performed from both sides of the metal-laminated plate 7, whereby through-holes are formed so as to penetrate through the top-side peeling film 50 and adhesive layer 52, the resin sheet 43, the bottom-side adhesive layer 52a and peeling film 50a. Openings H are thus formed.

Figure 12C:
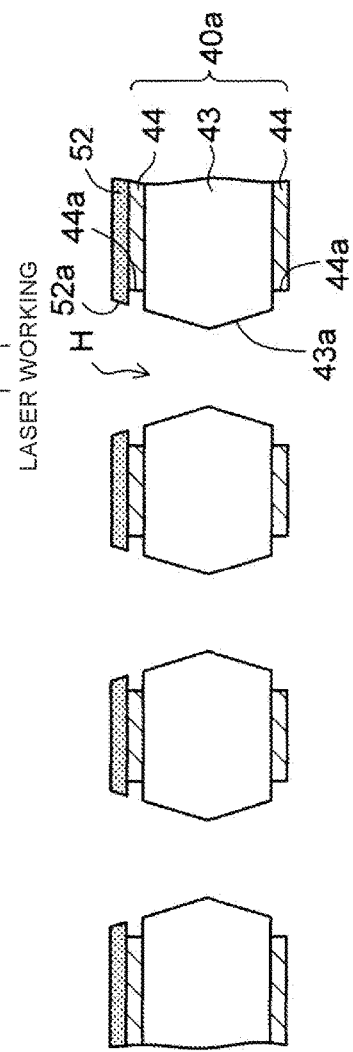

Subsequently, as shown in FIG. 12C, the top peeling film 50 is peeled off the laminated body shown in FIG. 12B so that the adhesive layer 52 remains and the bottom-side peeling film 50a and adhesive layer 52a are peeled off.

With the above-described process, a support base member 40a (with an adhesive layer 52) of the first example is obtained which have the same structure as shown in FIG. 11C.

In the second forming method of the support base member 40a of the first example, the peeling films 50 and 50a are bonded to the two respective surfaces of the metal-laminated plate 7. Since foreign substances such as chips that are produced by the laser boring stick to the peeling films 50 and 50a provided on the two respective sides, those foreign substances can be removed easily by peeling off the peeling films 50 and 50a on the two respective sides.

Furthermore, since the peeling films 50 and 50a located on the two respective sides function as laser light absorption layers that increase the laser light absorption ratio, the above-mentioned blackening treatment that is performed on the metal layers 44 in the step shown in FIG. 10B can be omitted.

The support base member 40a of the first example is formed using the metal-laminated plate 7 of the same kind as used in common printed wiring boards. This makes it possible to form a support base member that has openings and is high in stiffness using an existing printed wiring board manufacturing facility.

Next, a support base member 40b of a second example will be described. As shown in FIG. 13A, a forming method of the support base member 40b of the second example is different from the above-described first forming method of the support base member 40a of the first example in that in a step corresponding to the step shown in FIG. 10C openings 52a that are one-size larger than openings H to be formed are formed in advance through the adhesive layer 52 of the adhesive layer 5 with a peeling film.

Then, as shown in FIG. 13B, the adhesive layer 5 with a peeling film is bonded to the metal-laminated plate 7 in the same manner as in the step shown in FIG. 11A. The diameter of the openings 52a of the adhesive layer 52 of the adhesive layer 5 with a peeling film is set approximately equal to that of the openings 44a of the metal layers 44 of the metal-laminated plate 7.

Subsequently, as shown in FIG. 14A, in the same manner as in the step shown in FIG. 11B, openings H are formed by performing laser working on the laminated body shown in FIG. 13B from both sides. Then, as shown in FIG. 14B, as in the above-described step shown in FIG. 11C, the peeling film 50 is removed (peeled off) in such a manner that the adhesive layer 52 remains on the top metal layer 44 formed on the resin sheet 43.

With the above process, a support base member 40b (with an adhesive layer 52) of the second example is obtained. In the support base member 40b of the second example, the diameter of the openings 52a of the adhesive layer 52 can be set approximately equal to that of the openings 44a of the metal layers 44.

As a result, the position P1 of the inner walls of each set of an opening 52a of the adhesive layer 52 and openings 44a of the metal layers 44 are located outside (stand back from) the position P2 of the top end of the associated through-hole 43a of the resin sheet 43.

Thus, when the support base member 40b of the second example shown in FIG. 14B is bonded to the multilayer wiring layer ML shown in FIG. 8 with the adhesive layer 52, parts of the adhesive layer 52 are less prone to flow onto the pads P1 than in the support base member 40a of the first example shown in FIG. 11C.

In the support base member 40b of the second example, since as described above the openings 52a are formed in advance through the adhesive layer 52 of the adhesive layer 5 with a peeling film, the inner walls of the openings 52a of the adhesive layer 52 can be located at desired positions.

Figure 15A:
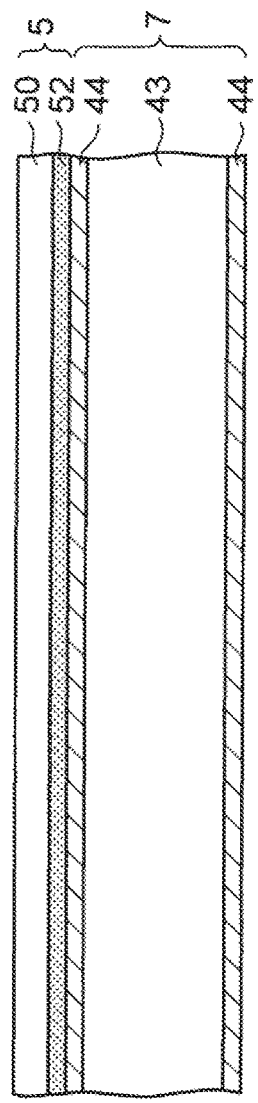
FIGS. 15A-15C are sectional views showing a forming method of a support base member of a third example.

Next, a support base member 40c of a third example will be described. In a forming method of the support base member 40c of the third example, as shown in FIG. 15A, a metal-laminated plate 7 having the same structure as shown in FIG. 10A is prepared. In the forming method of the support base member 40c of the third example, the step of patterning the metal layers 44 of the metal-laminated plate 7 described above with reference to FIG. 10B is omitted and the metal layer 44 is kept without openings at this stage.

Then, in the same manner as shown in FIG. 11A, the adhesive layer 5 with a peeling film is bonded to the metal-laminated plate 7.

Figure 15B:
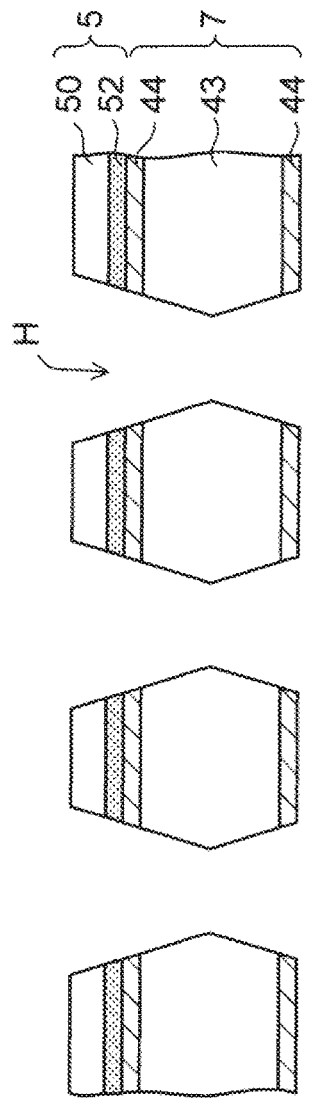
Figure 15C:
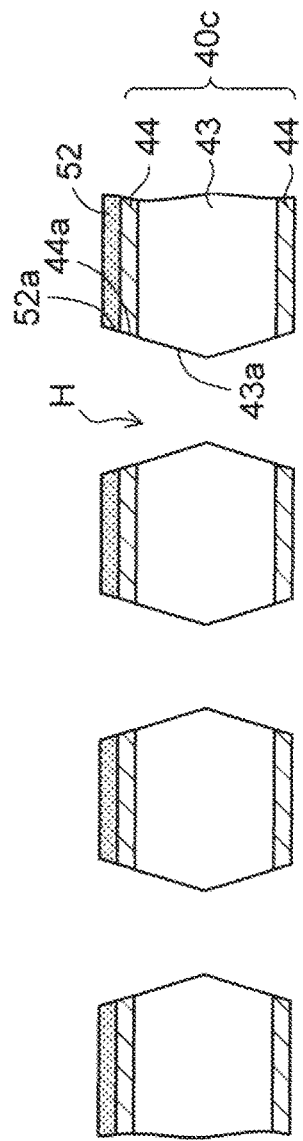

Subsequently, as shown in FIG. 15B, in the same manner as shown in FIG. 11B, openings H are formed by performing laser working on the laminated body shown in FIG. 15A from both sides. Then, as shown in FIG. 15C, as in the above-described step shown in FIG. 11C, the peeling film 50 is removed (peeled off) in such a manner that the adhesive layer 52 remains on the top metal layer 44 of the metal-laminated plate 7.

With the above-described process, a support base member 40c (with an adhesive layer 52) of the third example is obtained. In the support base member 40c of the third example, no openings are formed through the metal layer 44 of the metal-laminated plate 7 before formation of the openings H.

Thus, the inner wall of each opening 44a of the top metal layer 44 is formed approximately at the same position as the top end of the inner wall of the associated through-hole 43a of the resin sheet 43. No step is formed between the inner wall of each opening 44a of each metal layer 44 and the inner wall of the associated through-hole 43a of the resin sheet 43.

Also in the support base member 40C of the third example, since the diameter of each opening H at a halfway (middle) position in the height direction is set smaller than the diameter at its top end and bottom end, probe pins of an electrical characteristics measuring instrument can be prevented from coming into contact with the metal layers 44.

Next, a support base member 40d of a fourth example will be described. As shown in FIG. 16A, in a forming method of the support base member 40d of the fourth example, a resin sheet 43 is used in place of the above-described metal-laminated plate 7 shown in FIG. 10A. For example, the resin sheet 43 is a substrate obtained by removing the metal layers 44 from the metal-laminated plate 7.

Alternatively, an insulative base member such as a ceramic plate may be used instead of the resin sheet 43. An adhesive layer 5 with a peeling film is bonded to the resin sheet 43.

Subsequently, as shown in FIG. 16B, in the same manner as shown in FIG. 11B, openings H are formed by performing laser working on the laminated body shown in FIG. 16A from both sides.

Thus, the inner wall of each opening 52a of the adhesive layer 52 is formed approximately at the same position as the top end of the inner wall of the associated through-hole 43a of the resin sheet 43. No step is formed between the inner wall of each opening 52a of the adhesive layer 52 and the inner wall of the associated through-hole 43a of the resin sheet 43.

Then, as shown in FIG. 16C, as in the above-described step shown in FIG. 11C, the peeling film 50 is removed (peeled off) in such a manner that the adhesive layer 52 remains on the resin sheet 43.

With the above-described process, a support base member 40d (with an adhesive layer 52) of the fourth example is obtained. The support base member 40d of the fourth example employs the resin sheet 43 to which no metal layer is bonded. Since portions of no metal layer are exposed in the inner walls of the openings H, it is not necessary to give consideration to contact of probe pins of an electrical characteristics measuring instrument to metal layers.

An alternative mode is possible in which a support base member 40d is formed by a metal plate. In this case, for example, openings are formed through the metal plate and metal oxide layers are formed by oxidizing its entire surfaces. Then an adhesive layer through which openings are formed is bonded to the metal plate.

Figure 17:
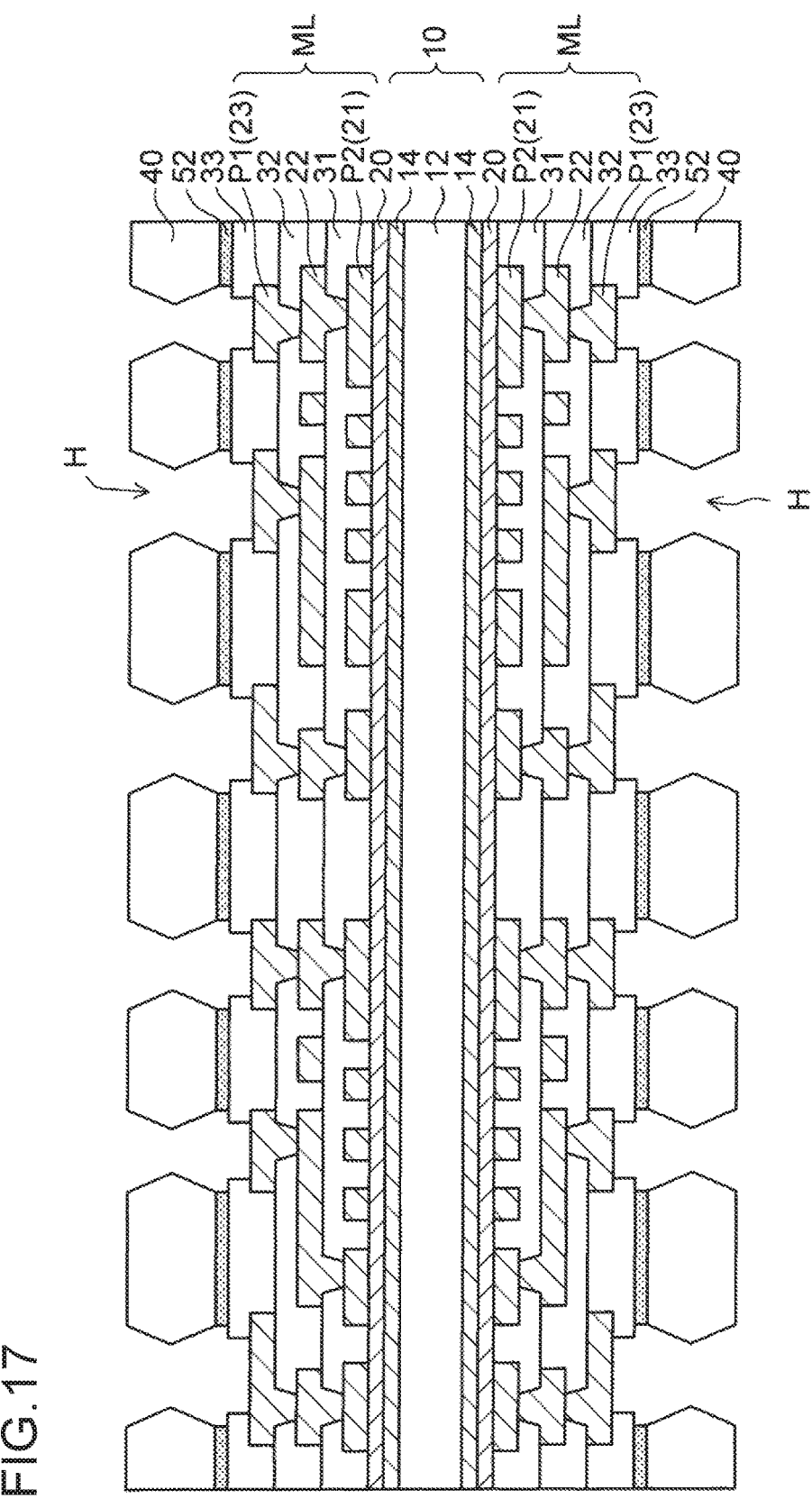
FIG. 17 is a sectional view, that is, a third set of drawings, showing the manufacturing method of a wiring board according to the first embodiment.

After the formation of the support base member 40 (see FIGS. 9A and 9B), as shown in FIG. 17, the support base member 40 shown in FIG. 9B is bonded to the top multilayer wiring layer ML of the above-described laminated body shown in FIG. 8. Likewise, the support base member 40 shown in FIG. 9B is bonded to the bottom multilayer wiring layer ML of the laminated body shown in FIG. 8.

The support base member 40 is the general version of the above-described support base members 40a-40d of the first to fourth examples. One of the support base members 40a-40d of the first to fourth examples which are preferable examples is used as the support base member 40.

The plural openings H of each support base member 40 are arranged so as to correspond to the outermost pads P1 of the associated multilayer wiring layer ML shown in FIG. 8. As a result, the pads P1 are exposed in the plural respective openings H of the support base member 40.

As described above, the support base members 40 through which the openings H are formed in advance are bonded to the respective multilayer wiring layers ML. It is therefore not necessary to form openings H by laser working or drilling after bonding of the support base members 40 to the multilayer wiring layers ML.

This can solve the problems that an oxide film is formed on the surfaces of the pads P1 of the multilayer wiring layers ML or portions, around the pads P1, of the solder resist layers 33 are removed. Furthermore, there is no risk that the surfaces of the pads P1 of the multilayer wiring layers ML are damaged by drilling.

Figure 18:
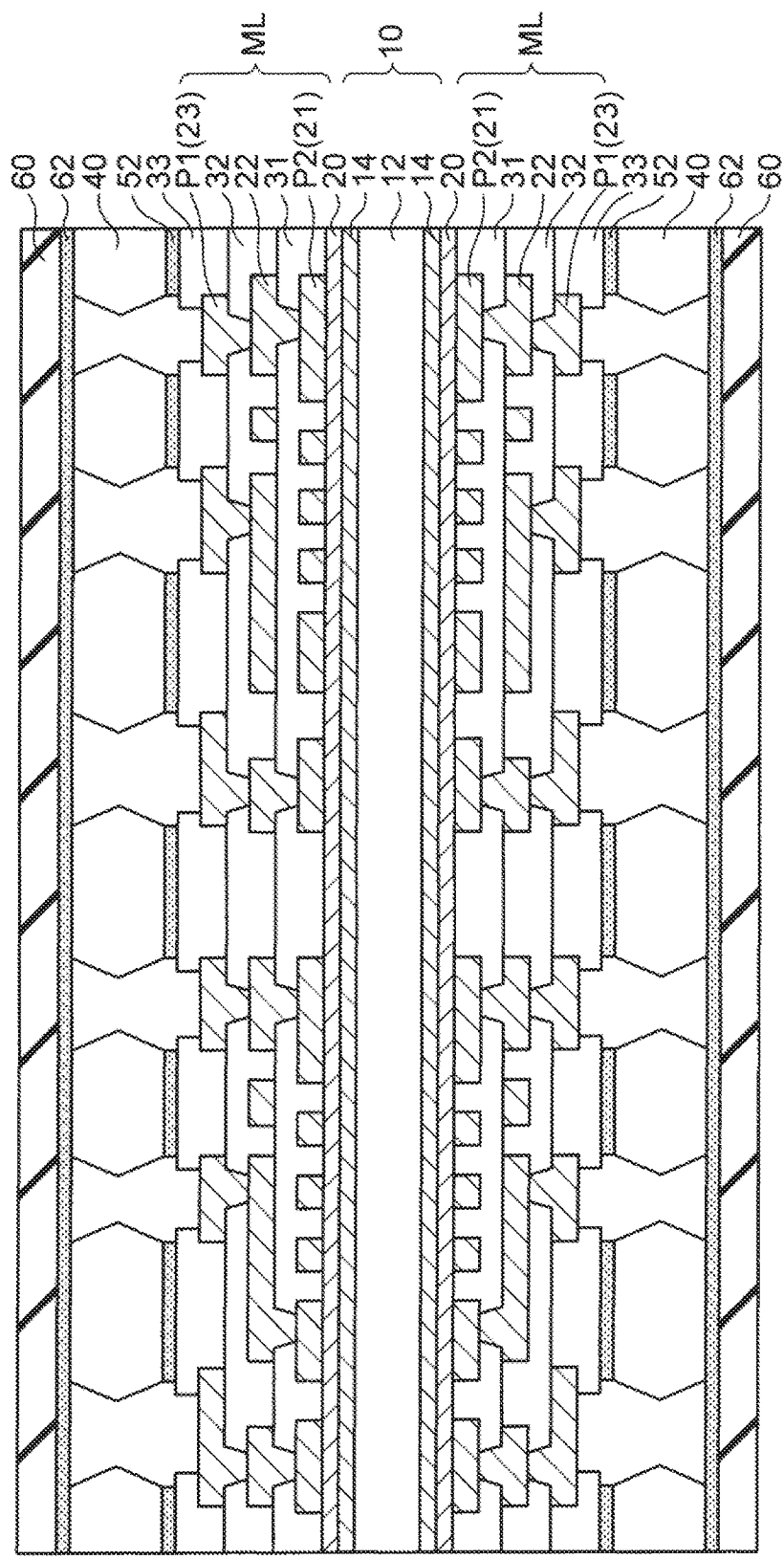
FIG. 18 is a sectional view, that is, a fourth set of drawings, showing the manufacturing method of a wiring board according to the first embodiment.

Subsequently, as shown in FIG. 18, protective films 60 are adhered, with respective adhesive layers 62, to the respective support base members 40 bonded to the outer surfaces of the respective multilayer wiring layers ML which are formed on the tentative substrate 10 on the two respective sides.

Figure 19:
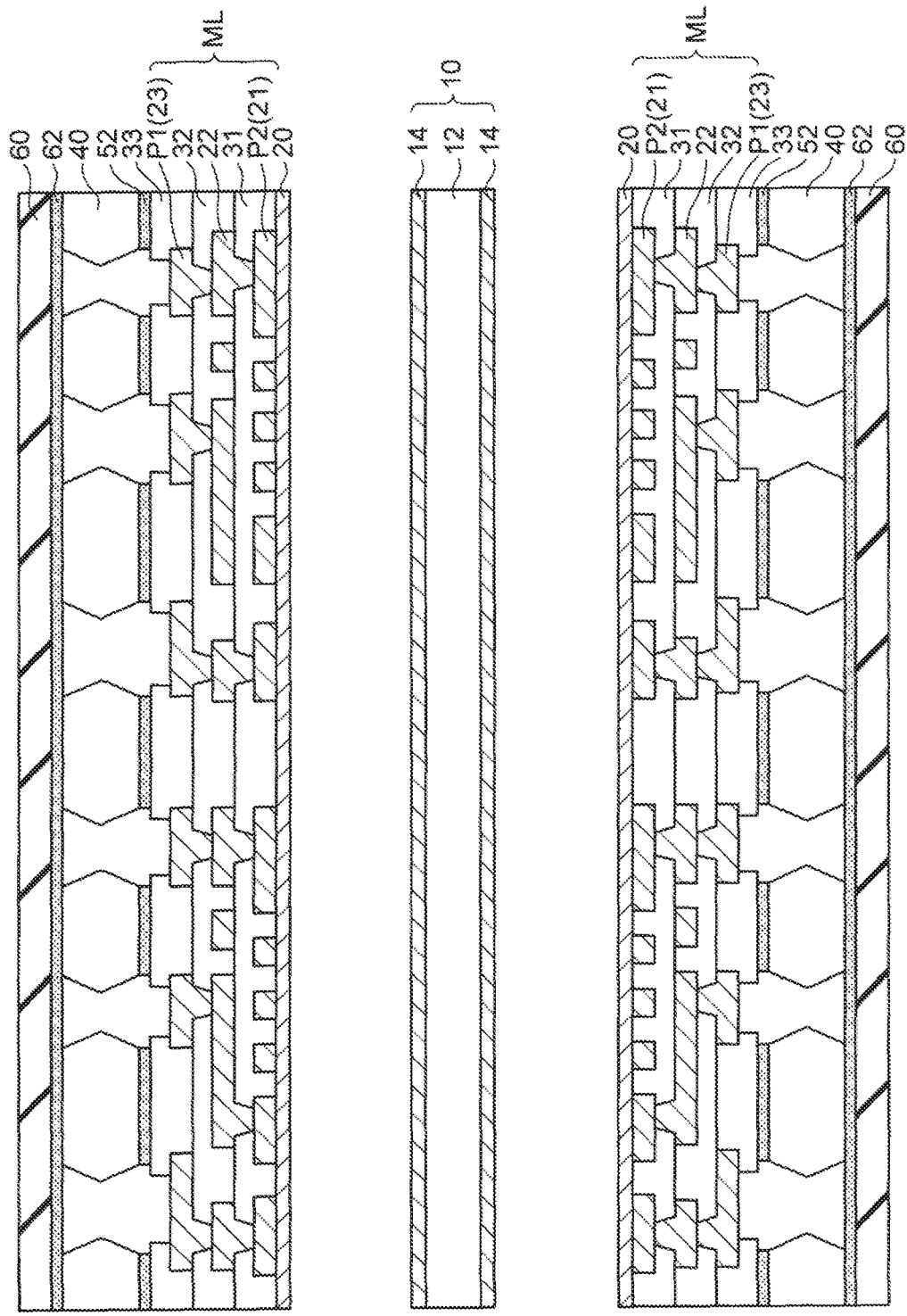
FIG. 19 is a sectional view, that is, a fifth set of drawings, showing the manufacturing method of a wiring board according to the first embodiment.

Then, in the laminated body shown in FIG. 18, as shown in FIG. 19, the metal layers 20 are peeled off the adhesive layers 14, located on the two respective sides, of the tentative substrate 10. As a result, the two multilayer wiring layers ML are obtained which are separated from the two respective surfaces of the tentative substrate 10 in such a manner that each of them is reinforced by the support base member 40 and the protective film 60. Each multilayer wiring layer ML is obtained in such a manner that the metal layer 20 remains on the side it has been peeled off the tentative substrate 10.

Figure 20:
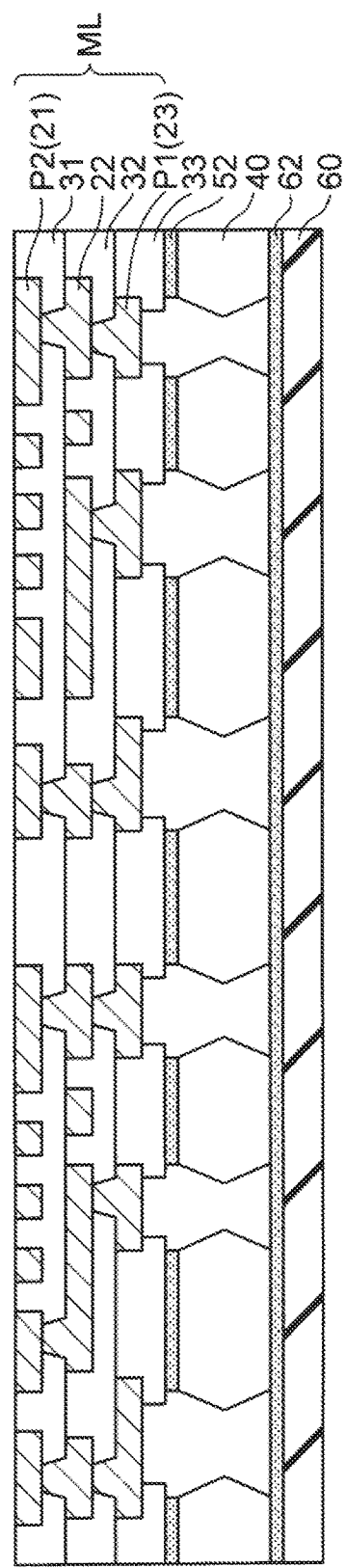
FIG. 20 is a sectional view, that is, a sixth set of drawings, showing the manufacturing method of a wiring board according to the first embodiment.
Figure 21:
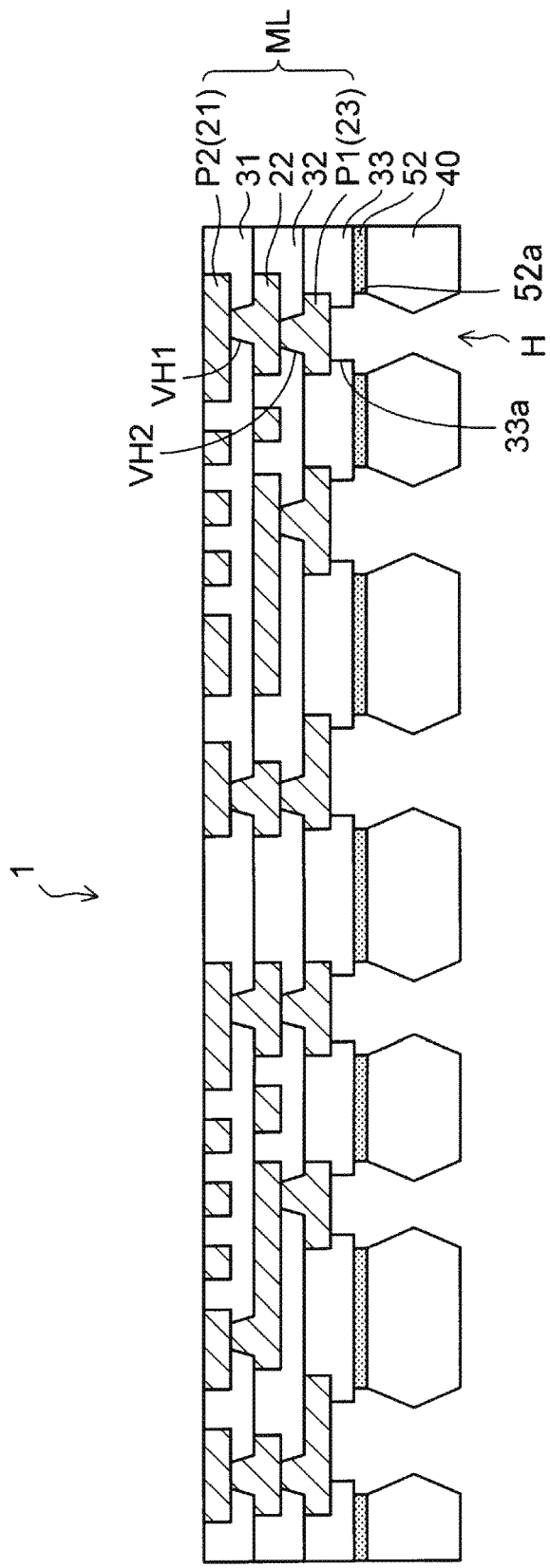
FIG. 21 is a sectional view of a wiring board according to the first embodiment.

Then, as shown in FIG. 20, the metal layer 20 is removed (etched away) from each multilayer wiring layer ML by a nitric-acid-based wet etching liquid. The use of the nitric-acid-based wet etching liquid makes it possible to etch the metal layer 20 selectively with respect to the pads P2 (copper) and the insulating layer 31 (resin).

Then, as shown in FIG. 21, the protective film 60 and the adhesive layer 62 are removed from (peeled off) each support base member 40. With the above-described process, wiring boards 1 according to the first embodiment are obtained.

As shown in FIG. 21, each wiring board 1 according to the first embodiment is equipped with the multilayer wiring layer ML having the structure described above with reference to FIG. 8. The multilayer wiring layer ML has the insulating layer 31 and the pads P2 (wiring layer 21) at the top. The pads P2 are an example of the term "second pads."

The bottom surface and the side surfaces of each pad P2 are buried in the insulating layer 31 and the top surface of each pad P2 is exposed from the insulating layer 31. The top surface of each pad P2 is flush with the top surface of the insulating layer 31.

The wiring layer 22 is formed under the insulating layer 31. The wiring layer 22 is connected to the bottom surfaces of the pads P2 by the via conductors formed in the respective via holes VH1 which are formed in the insulating layer 31.

The pads P1 (wiring layer 23) are formed under the insulating layer 32. The pads P1 are connected to the bottom surface of the wiring layer 22 by the via conductors formed in the respective via holes VH2 which are formed in the insulating layer 32. The insulating layer 32 is an example of an insulating layer whose bottom surface is provided with a wiring layer. The pads P1 are an example of the first pads.

The solder resist layer 33 in which the openings 33a are formed under the bottom surfaces of the pads P1 is formed under the insulating layer 32. The solder resist layer 33 is an example of the protective insulating layer.

The solder resist layer 33 covers the bottom surface of the insulating layer 32 and has the openings 33a which expose portions of the wiring layer 23 (pads P1).

As described above, the multilayer wiring layer ML is equipped with the insulating layers 31 and 32 and the wiring layers 21, 22, and 23 which are laid on each other alternately. The top surfaces of the insulating layer 31 and the wiring layer 21 which are top layers are exposed. The top pads P2 of the multilayer wiring layer ML are used as pads for mounting of electronic components. The bottom pads P1 of the multilayer wiring layer ML are used as pads for connection of external connection terminals.

The adhesive layer 52 is formed under the solder resist layer 33. The support base member 40 is bonded to the solder resist layer 33 with the adhesive layer 52. The openings H of the support base member 40 are located under the respective openings 33a of the solder resist layer 33. The openings H of the support base member 40 communicate with the openings 33a of the solder resist layer 33 via the openings 52a of the adhesive layer 52, respectively.

FIGS. 22A and 22B are a partial enlarged sectional view and a partial enlarged plan view, respectively, showing one opening H and its neighborhood of the wiring board 1 shown in FIG. 21.

As shown in FIG. 22A which is a sectional view, a central portion of the pad P1 is exposed from the opening 33a of the solder resist layer 33 and a peripheral portion of the pad P1 is covered with the solder resist layer 33.

The support base member 40 is bonded to the solder resist layer 33 from below with the adhesive layer 52. The opening 52a of the adhesive layer 52 is located under the opening 33a of the solder resist layer 33. The opening H of the support base member 40 is located under the opening 52a of the adhesive layer 52. The opening 52a communicates with the opening H and the opening 33a.

The ring-shaped projection D projects inward from the inner wall of the opening H at a halfway (middle) position of the opening H in its height direction.

Additionally referring to FIG. 22B which is a plan view, the diameter B at the halfway position, in the height direction, of the opening H of the support base member 40 is set smaller than the diameter A1 of the top end of the opening H and the diameter A2 of its bottom end.

Although in the example of FIG. 22A the halfway position of the opening H in its height direction is set approximately the same as the center in the height direction, the halfway position may be deviated upward or downward from the center.

The diameter B at the halfway position of the opening H in its height direction is set smaller than the diameter X of the opening 33a of the solder resist layer 33.

The top diameter A1 of the opening H is set larger than the diameter X of the opening 33a of the solder resist layer 33. As a result, the inner wall of the opening 52a of the adhesive layer 52 is located outside (stands back from) the inner wall of the opening 33a of the solder resist layer 33.

As described above, the top diameter A1 of the opening H, the diameter X of the opening 33a of the solder resist layer 33, and the diameter B at the halfway position of the opening H in its height direction have a relationship A1>X>B.

For example, the diameter A1 is in a range of 250 to 300 μm, the diameter X is in a range of 200 to 250 μm, and the diameter B is in a range of 150 to 200 μm.

As described above, the support base member 40 has the top surface on which the adhesive layer 52 is formed and the bottom surface which is opposite to the top surface. The diameter B at the halfway position, in the height direction, of the opening H of the support base member 40 is set smaller than the diameters A1 and A2 of the opening H of the support base member 40 in its top surface and bottom surface and the diameter X of the opening 33a of the solder resist layer 33 (protective insulating layer).

As described in the forming method of the support base member 40, before the bonding of the support base member 40 to the multilayer wiring layer ML with the adhesive layer 52, an inner wall portion of the opening 52a of the adhesive layer 52 has not only contracted and receded due to heat generated by laser working but also hardened thermally to lose flowability.

As can be seen from the above description, when the support base member 40 is bonded to the multilayer wiring layer ML with the adhesive layer 52, the pad P1 which is exposed from the opening 33a of the solder resist layer 33 and the adhesive layer 52 are separated from each other by a prescribed interval and the adhesive layer 52 has lost flowability. Thus, it can be prevented that part of the adhesive layer 52 flows onto the pad P1.

As described above, where the support base member 40a of the first example shown in FIG. 11C is used, since a space is formed under a portion, around the opening 52a, of the adhesive layer 52, even if part of the adhesive layer 52 flows out, it flows into the space and stays there and hence is not prone to flow onto the pad P1.

The above-mentioned space is defined by the inner wall of the opening 44a, the bottom surface of a portion, sticking inward from the inner wall of the opening 44a, of the adhesive layer 52, and the top surface of a portion, sticking out inward from the inner wall of the opening 44a, of the resin sheet 43.

It is preferable that the interval between the top end of the inner wall of the opening H and the inner wall of the opening 33a of the solder resist layer 33 is set larger than a maximum positional deviation that would occur when the support base member 40 is bonded to the multilayer wiring layer ML. As a result, even if positional deviation occurs when the support base member 40 is bonded to the multilayer wiring layer ML, it can be prevented that part of the adhesive layer 52 is located under the pad P1.

As shown in FIG. 23, the quality of each product region R2 (see FIG. 7B) is judged by bringing probe pins of an electrical characteristics measuring instrument into contact with the pads P1 through the openings H.

At this time, since the diameter of the ring-shaped projection D of each opening H is smaller than the diameter of the associated opening 33a of the solder resist layer 33, the side surface of a probe pin 6 comes into contact with the ring-shaped projection D even if it is deviated.

Thus, the tip of the probe pin 6 does not hit the solder resist layer 33 and hence the solder resist layer 33 is prevented from being damaged by the probe pin 6. If a portion, around the pad P1, of the solder resist layer 33 is damaged, a failure of connection between the pad P1 and a solder bump or an appearance failure would occur.

It is also preferable that the interval between the tip of the ring-shaped projection D in the opening H and the inner wall of the opening 33a of the solder resist layer 33 be set larger than the maximum positional deviation that would occur when the support base member 40 is bonded to the multilayer wiring layer ML.

With this measure, even if positional deviation occurs when the support base member 40 is bonded to the multilayer wiring layer ML, the solder resist layer 33 is prevented from being damaged by the probe pin 6 because in a plan view no portion of the solder resist layer 33 comes to be located in the region, enclosed by the ring-shaped projection D, of the opening H.

As described above, in the wiring board 1 according to the first embodiment, the support base member 40 through which the openings H are formed in advance are bonded to the multilayer wiring layer ML.

This can solve the problems that an oxide film is formed on the surfaces of the pads P1 of the multilayer wiring layer ML or portions, around the pads P1, of the solder resist layers 33 are removed by laser working. Furthermore, there is no risk that the surfaces of the pads P1 of the multilayer wiring layers ML are damaged by drilling.

Figure 24:
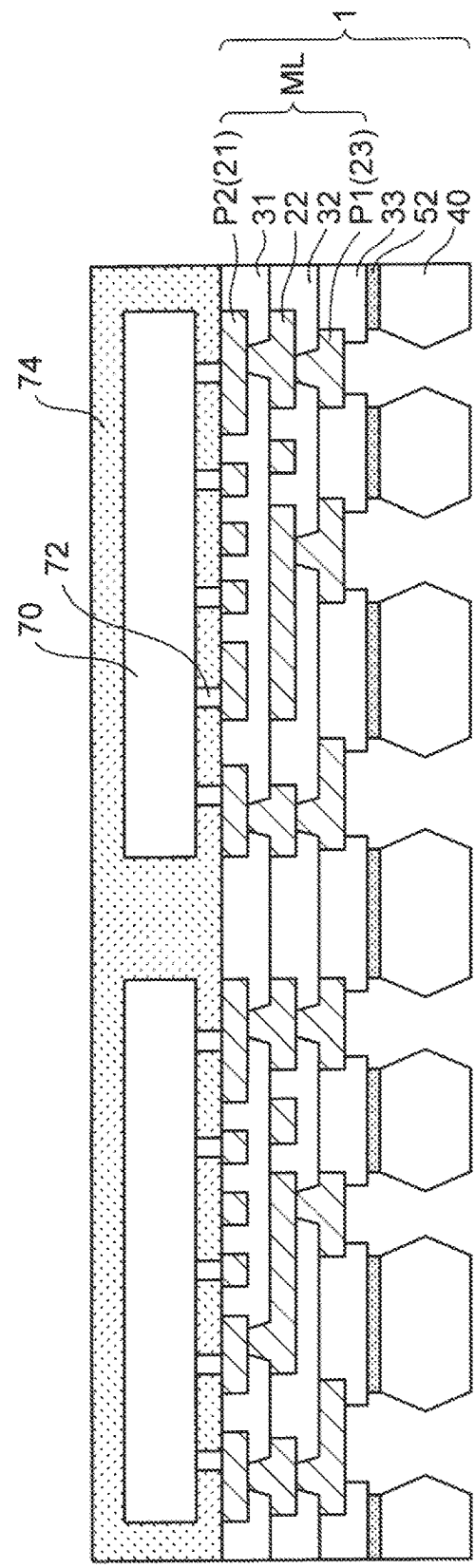
FIG. 24 is a first sectional view showing a manufacturing method of electronic component devices using the wiring board shown in FIG. 21.

Next, a method for manufacturing electronic component devices using the wiring board 1 according to the first embodiment will be described. As shown in FIG. 24, semiconductor chips 70 as electronic components are prepared and connection terminals 72 of the semiconductor chips 70 are flip-chip-connected to the top pads P2 of the wiring board 1 shown in FIG. 21.

The semiconductor chips 70 are then sealed with a sealing resin 74. The side surfaces and the top surface of each semiconductor chip 70 are sealed with the sealing resin 74 while the space between the semiconductor chip 70 and the wiring board 1 is filled with the sealing resin 74.

Figure 25:
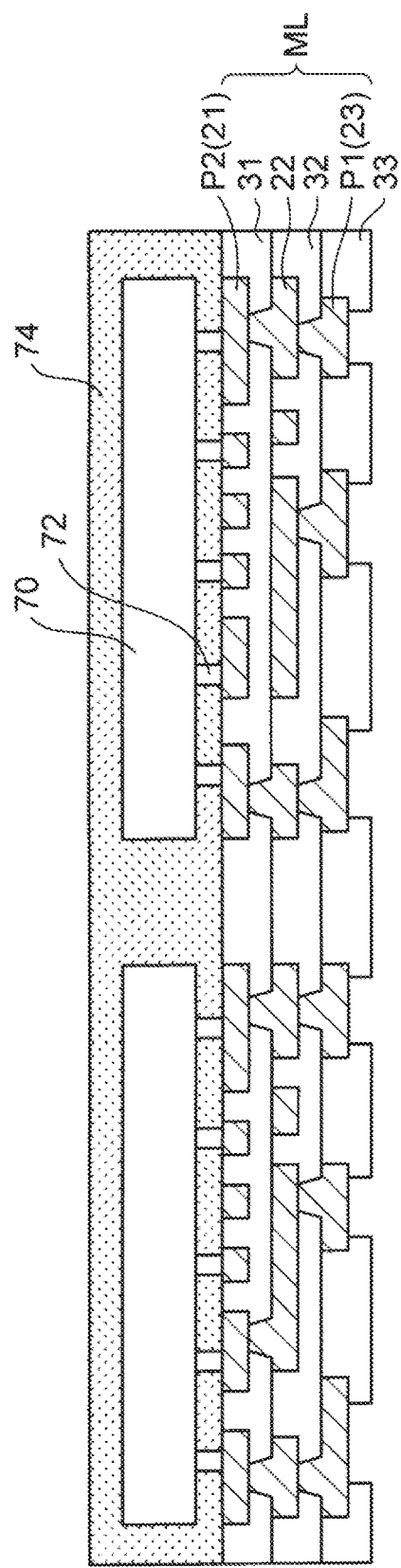
FIG. 25 is a second sectional view showing the manufacturing method of electronic component devices using the wiring board shown in FIG. 21.

Then, as shown in FIG. 25, the support base member 40 and the adhesive layer 52 are removed from (peeled off) the wiring board 1, whereby the bottom surface of the solder resist layer 33 which is the lowermost layer of the multilayer wiring layer ML. Then, as shown in FIG. 26, solder balls are formed on surfaces, exposed in the openings 33a of the solder resist layer 33, of the pads P1, respectively, and subjected to reflow processing, whereby solder bumps SB are formed.

As described above, the openings 33a, formed according to a designed specification, of the solder resist layer 33 are located under the bottom surfaces of the pads P1 and hence the surfaces of the pads P1 are free of damage. As a result, solder bumps SB that are uniform in height can be formed reliably on the plural respective pads P1 of the multilayer wiring layer ML.

Figure 26:
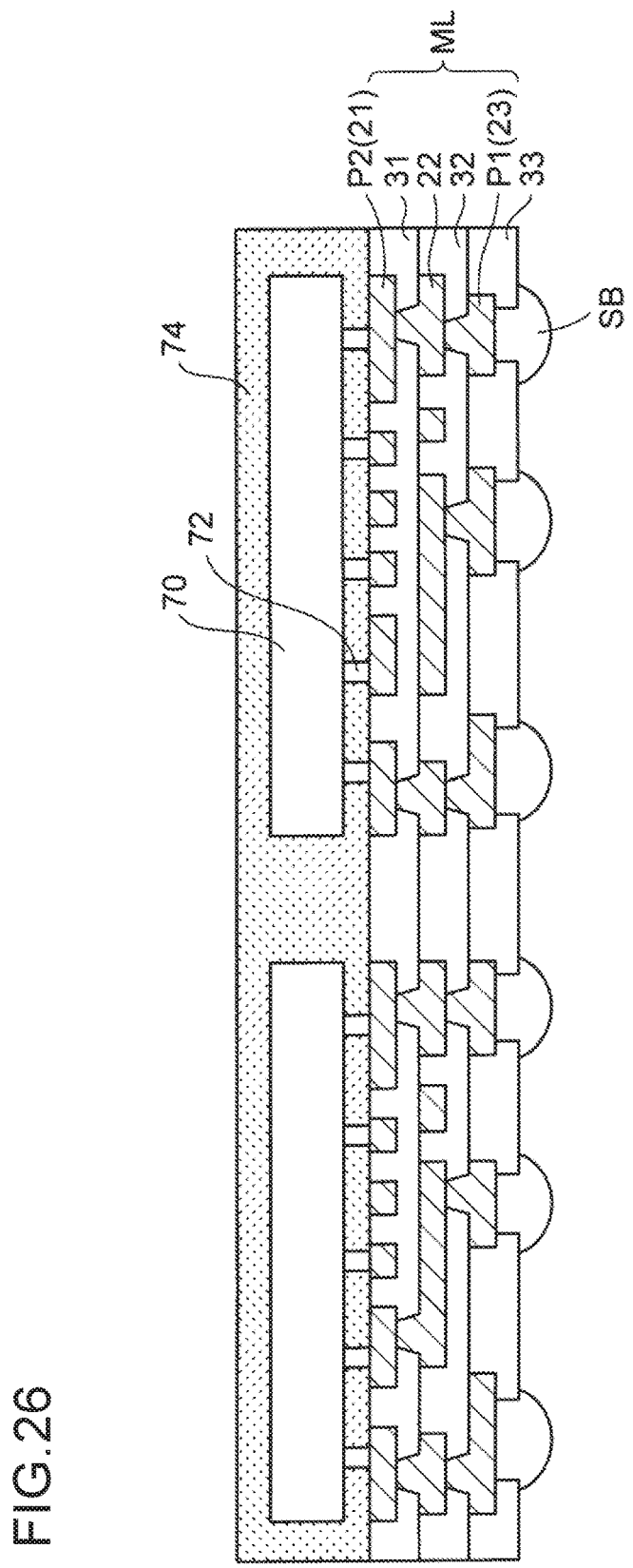
FIG. 26 is a third sectional view showing the manufacturing method of electronic component devices using the wiring board shown in FIG. 21.
Figure 27:
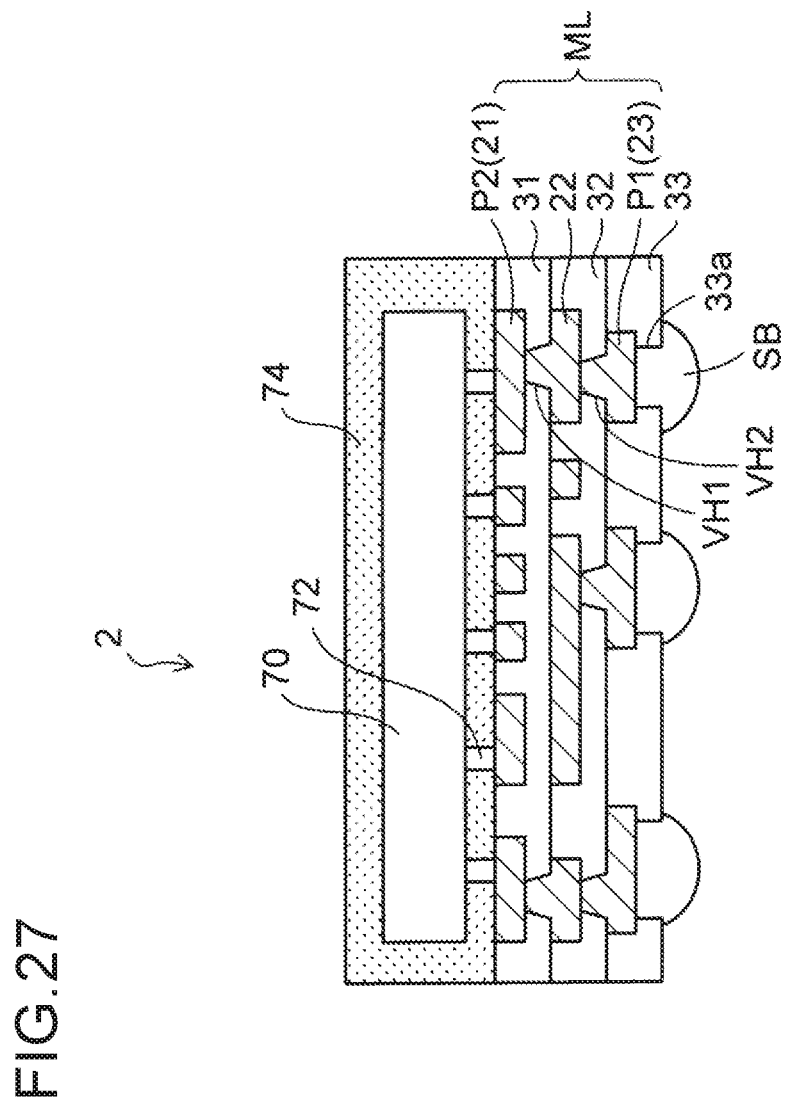
FIG. 27 is a sectional view showing an electronic component device that employs the wiring board shown in FIG. 21.

Subsequently, as shown in FIG. 27, the laminated body shown in FIG. 26 is cut into individual regions R2 (see FIG. 7B). Individual electronic component devices 2 are thus obtained.

Embodiment 2

FIGS. 28A and 28B to FIG. 32 are views for description of a support base member to be used for producing a wiring board according to a second embodiment. FIG. 33 and FIGS. 34A and 34B are views for description of the wiring board according to the second embodiment.

The second embodiment is different from the first embodiment in the sectional shape of the openings of the support base member to be used for producing a wiring board. In the second embodiment, descriptions of elements and steps having the same ones in the first embodiment will be omitted.

As shown in FIG. 28A, like the above-described support base member 40 shown in FIG. 9A which is employed in the first embodiment, a support base member 41 to be used for producing the wiring board according to the second embodiment is an insulating base member and an adhesive layer 52 and a peeling film 50 are formed in this order on one surface of the insulating base member.

As in the support base member 40 shown in FIG. 9A, openings H are formed so as to penetrate through the peeling film 50, the adhesive layer 52, and the support base member 41 (from the top surface of the peeling film 50 to the bottom surface of the support base member 41).

Subsequently, when the support base member 41 is bonded to each multilayer wiring layer ML, as shown in FIG. 28B the peeling film 50 is peeled off the support base member 41 to expose the adhesive layer 52. A support base member 41 with an adhesive layer 52 is thus obtained.

In the support base member 41 according to the second embodiment, the diameter A2 of each opening H at its bottom end is set smaller than its diameter A1 at its top end. In a sectional view, each opening H is forward-tapered so that its diameter decreases as the position goes from the top end to the bottom end. The support base member 41 is a general version of support base members 41a-41d of first to fourth examples (described later).

FIGS. 29A-29C show a forming method of a support base member 41a of a first example. As shown in FIG. 29A, the same laminated body as show in FIG. 11A is prepared by executing the above-described steps of the first embodiment shown in FIGS. 10A-11A.

Then, through-holes are formed through the adhesive layer 5 with a peeling film and the resin sheet 43 in regions corresponding to the openings 44a of the metal layers 44. These regions are one-size smaller than the openings 44a of the metal layers 44.

That is, the inner walls of each pair of openings 44a of the metal layers 44 located on the two respective sides are located outside (stand back from) the bottom end of the associated through-hole 43a of the resin sheet 43.

Subsequently, as shown in FIG. 29B, opening H are formed by performing laser working on the resulting laminated body from the side of the peeling film 50. The peeling film 50 is then peeled off the laminated body shown in FIG. 29B so that the adhesive layer 52 remains.

A hole formed by laser working decreases in diameter as the position goes away from the surface. Thus, as shown in FIG. 29C, where the openings H (the through-holes 43a of the resin sheet 43) are formed by performing laser working from the top side of the laminated body, the bottom diameter A2 becomes smaller than the top diameter A1.

With the above-described process, a support base member 41a (with an adhesive layer 52) of the first example can be obtained.

Figure 30:
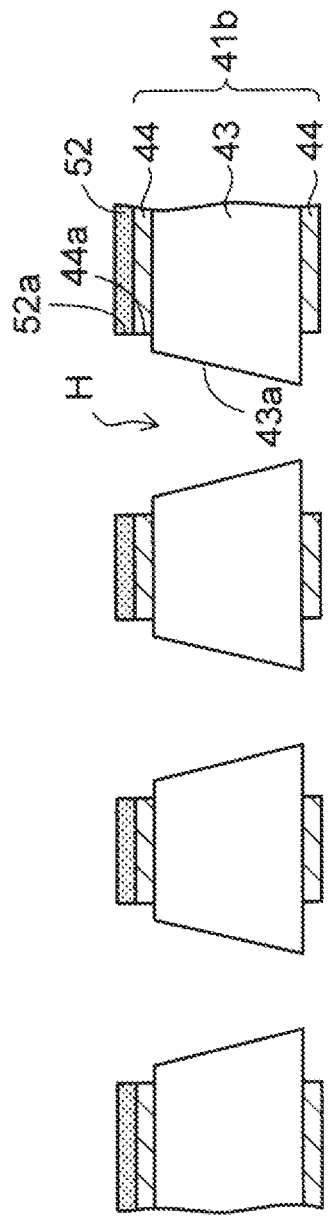
FIG. 30 is a sectional view of a support base member of a second example to be used for producing the wiring board according to the second embodiment.

FIG. 30 shows a support base member 41b (with an adhesive layer 52) of a second example. To form the support base member 41b of the second example, the above-described forming method according to the first embodiment shown in FIGS. 13A-14B (more specifically, the step shown in FIG. 14A) is modified such that laser working is performed only from the top side, whereby openings H that are forward-tapered in a sectional view are formed.

In this step, as in the step shown in FIG. 14B, the diameter of each opening 52a of the adhesive layer 52 of the adhesive layer 5 with a peeling film is set approximately the same as the diameter of the associated openings 44a of the metal layers 44 of the metal-laminated plate 7.

As a result, the inner wall of each opening 52a of the adhesive layer 52 and the inner wall of the associated openings 44a of the metal layers 44 are located outside (stand back from) the top end of the associated through-hole 43a of the resin sheet 43.

Figure 31:
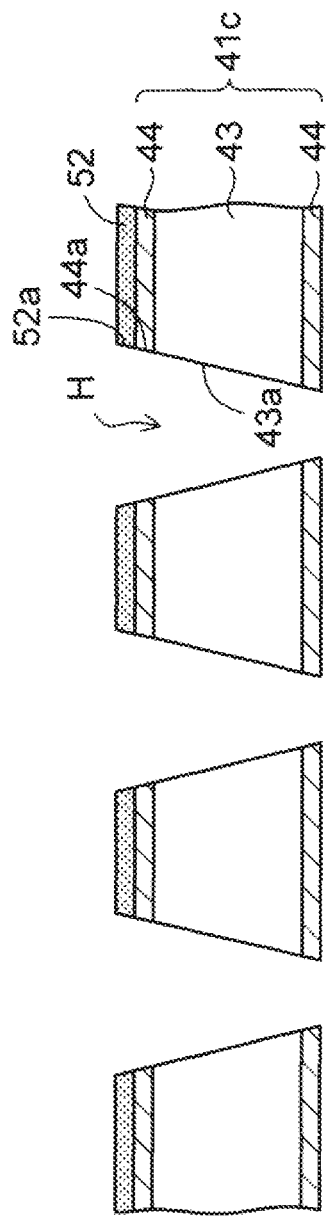
FIG. 31 is a sectional view of a support base member of a third example to be used for producing the wiring board according to the second embodiment.

FIG. 31 shows a support base member 41c (with an adhesive layer 52) of a third example. To form the support base member 41c of the third example, the above-described forming method according to the first embodiment shown in FIGS. 15A-15C (more specifically, the step shown in FIG. 15B) is modified such that laser working is performed only from the top side, whereby openings H that are forward-tapered in a sectional view are formed.

In this step, as in the step shown in FIG. 15C, the inner wall of each opening 44a of the top metal layer 44 is located approximately at the same position as the top end of the inner wall of the associated through-hole 43a of the resin sheet 43. No step is formed between the inner wall of each opening 44a of each top metal layer 44 and the inner wall of the associated through-hole 43a of the resin sheet 43.

Figure 32:
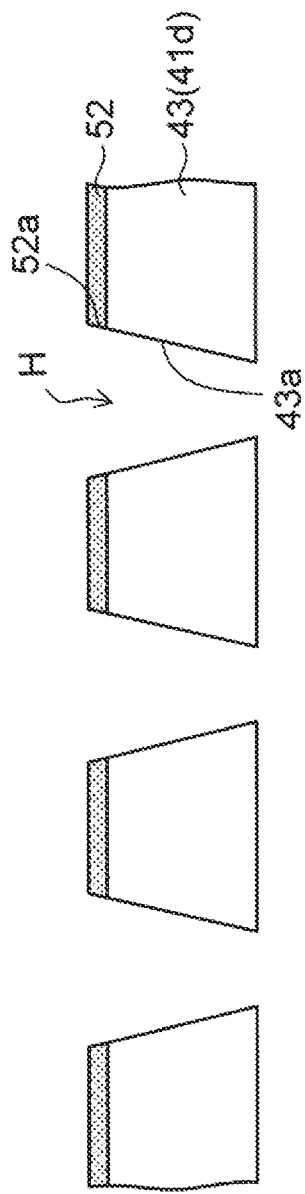
FIG. 32 is a sectional view of a support base member of a fourth example to be used for producing the wiring board according to the second embodiment.
Figure 33:
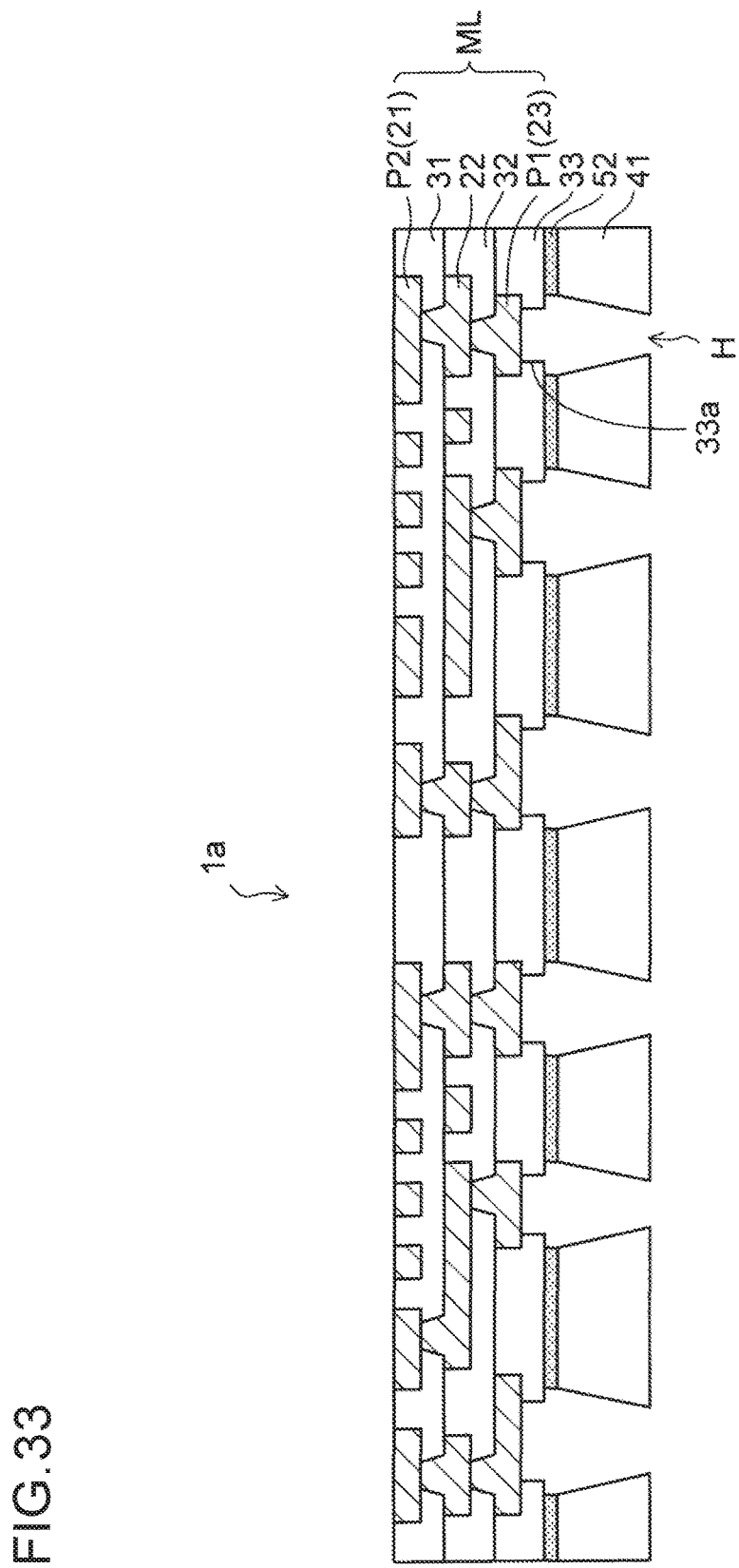
FIG. 33 is a sectional view of a wiring board according to the second embodiment.

FIG. 32 shows a support base member 41d (with an adhesive layer 52) of a fourth example. To form the support base member 41d of the fourth example, the above-described forming method according to the first embodiment shown in FIGS. 16A-16C (more specifically, the step shown in FIG. 16B) is modified so that laser working is performed only from the top side, whereby openings H that are forward-tapered in a sectional view are formed.

In this step, as in the step shown in FIG. 16C, the inner wall of each opening 52a of the adhesive layer 52 is located approximately at the same position as the top end of the inner wall of the associated through-hole 43a of the resin sheet 43. No step is formed between the inner wall of each opening 52a of the adhesive layer 52 and the inner wall of the associated through-hole 43a of the resin sheet 43.

A wiring board 1a according to the second embodiment is obtained by executing the above-described steps shown in FIGS. 17-21 using the support base member 41 shown in FIG. 28B.

In the wiring board 1a according to the second embodiment, the support base member 41 shown in FIG. 28B is bonded from below, with an adhesive layer 52, to the solder resist layer 33 of the same multilayer wiring layer ML as of the above-described wiring board 1 according to the first embodiment shown in FIG. 21.

One of the above-described support base members 41a-41d of the first to fourth examples which are preferable examples is used as the support base member 41.

FIGS. 34A and 34B are a partial enlarged sectional view and a partial enlarged plan view, respectively, showing one opening H and its neighborhood of the wiring board 1a shown in FIG. 33.

As shown in FIG. 34A which is a sectional view, the wiring board 1a is equipped with, at the bottom of the multilayer wiring layer ML, the pads P1 and the solder resist layer 33 whose openings 33a are formed under the respective pads P1. The pads P1 are an example of the term "first pads" and the solder resist layer 33 is an example of the term "protective insulating layer."

The support base member 41 is bonded to the solder resist layer 33 from below with the adhesive layer 52. Each opening 52a of the adhesive layer 52 is located under the associated opening 33a of the solder resist layer 33. And each opening H of the support base member 41 is located under the associated opening 52a of the adhesive layer 52.

Additionally referring to FIG. 34B which is a plan view, the diameter A2 of the bottom end of the opening H in the bottom surface of the support base member 41 is set larger than the diameter A1 of its top end in the top surface of the support base member 41. The opening H is forward-tapered, that is, its diameter decreases as the position goes from its top end to its bottom end.

The diameter A2 of the bottom end of the opening H is set smaller than the diameter X of the opening 33a of the solder resist layer 33.

Furthermore, the diameter A1 at the top end of the opening H is set larger than the diameter X of the opening 33a of the solder resist layer 33. As a result, the inner wall of the opening 52a of the adhesive layer 52 is located outside (stands back from) the inner wall of the opening 33a of the solder resist layer 33. That is, the inner wall of the opening 52a of the adhesive layer 52 and the opening 33a of the solder resist layer 33 are spaced from each other by a prescribed interval.

As described above, the top diameter A1 of the opening H, the diameter X of the opening 33a of the solder resist layer 33, and the bottom diameter A2 of the opening H have a relationship A1>X>A2.

For example, the diameter A1 is in a range of 250 to 300 µm, the diameter X is in a range of 200 to 250 µm, and the diameter A2 is in a range of 150 to 200 µm.

As seen from the above description, when the support base member 41 is bonded to the multilayer wiring layer ML with the adhesive layer 52, as in the above-described wiring board 1 according to the first embodiment shown in FIG. 21, it can be prevented that part of the adhesive layer 52 flows onto the pad P1.

Furthermore, as described above with reference to FIG. 23, even if a probe pin (not shown) is deviated when it is brought into contact with the pad P1 through the opening H, the side surface of the probe pin comes into contact with the bottom end of the opening H.

Thus, the tip of the probe pin does not hit the solder resist layer 33 and hence the solder resist layer 33 is prevented from being damaged by the probe pin.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a wiring board, the method comprising:
  a) forming a wiring structure on a tentative substrate, wherein the wiring structure comprises: a first pad and a protective insulating layer having a first opening which exposes the first pad;
  b) forming a support base member, wherein the support base member has a second opening that exposes the first pad, and comprises a top surface on which an adhesive layer is formed and a bottom surface opposite to the top surface; and
  c) bonding the top surface of the support base member to the wiring structure with the adhesive layer such that the first opening is opposed to the second opening,
  wherein a diameter of the second opening at a position between the top surface and the bottom surface of the support base member in a thickness direction of the support base member is smaller than a diameter of the second opening at the top surface of the support base member and a diameter of the second opening at the bottom surface of the support base member, and smaller than a diameter of the first opening.

2) A method of manufacturing a wiring board, the method comprising:
  a) forming a wiring structure on a tentative substrate, wherein the wiring structure comprises: a first pad and a protective insulating layer having a first opening which exposes the first pad;
  b) forming a support base member, wherein the support base member has a second opening that exposes the first pad, and comprises a top surface on which an adhesive layer is formed and a bottom surface opposite to the top surface; and
  c) bonding the top surface of the support base member to the wiring structure with the adhesive layer such that the first opening is opposed to the second opening,
  wherein a diameter of the second opening at the bottom surface of the support base member is smaller than a diameter of the second opening at the top surface of the support base member.

3) The method according to clause (1) or (2), wherein:
  the diameter of the second opening at the top surface of the support base member is set larger than the diameter of the first opening;

the adhesive layer has a third opening which communicates with the first and second openings; and
an inner wall of the third opening is located outside an inner wall of the first opening.

4) The method according to clause (1) or (2), further comprising:
d) separating the wiring structure from the tentative substrate after the step (c).

5) The method according to clause (1) or (2), wherein the step b) comprises:
preparing a metal-laminated plate, wherein the metal-laminated plate comprises: a resin sheet comprising a top surface and a bottom surface opposite to the top surface; a first metal layer formed on the top surface of the resin sheet; and a second metal layer formed on the bottom surface of the resin sheet;
forming an opening in the first metal layer;
forming an opening in the second metal layer;
providing an adhesive layer with a peeling film on the metal-laminated plate;
forming the second opening in the support base member, by performing laser machining at least on a portion of the peeling film which is opposed to the opening of the first metal layer and a portion of the resin sheet which is exposed through the opening of the first metal layer; and
removing the peeling film from the adhesive layer.

6) The method according to clause (5), wherein
the second opening has: a through hole of the resin sheet; the opening of the first metal layer; and the opening of the second metal layer, and
no step is formed between an inner wall of the opening of the first metal layer and an inner wall of the through hole of the resin sheet.

What is claimed is:

1. A wiring board comprising:
a wiring structure comprising:
    a first insulating layer;
    a first wiring layer formed on a bottom surface of the first insulating layer; and
    a protective insulating layer which covers the bottom surface of the first insulating layer and has a first opening that exposes a portion of the bottom surface of the first wiring layer, wherein the portion of the bottom surface of the first wiring layer, which is exposed through the first opening, serves as a first pad; and
a support base member which is bonded to the protective insulating layer with an adhesive layer and has a second opening that exposes the first pad,
wherein:
the support base member comprises a top surface on which the adhesive layer is formed and a bottom surface opposite to the top surface; and
a diameter of the second opening at a position between the top surface and the bottom surface of the support base member in a thickness direction of the support base member is smaller than a diameter of the second opening at the top surface of the support base member and a diameter of the second opening at the bottom surface of the support base member, and smaller than a diameter of the first opening.

2. The wiring board according to claim 1, wherein:
the diameter of the second opening at the top surface of the support base member is set larger than the diameter of the first opening;
the adhesive layer has a third opening which communicates with the first and second openings; and
an inner wall of the third opening is located outside an inner wall of the first opening.

3. The wiring board according to claim 1, wherein:
the wiring structure further comprises:
    a second wiring layer which comprises: a top surface; a bottom surface opposite to the top surface; and a side surface between the top surface and the bottom surface, and is electrically connected to the first wiring layer; and
    a second insulating layer which covers the bottom surface and the side surface of the second wiring layer; and
the top surface of the second wiring layer serves as a second pad.

4. The wiring board according to claim 1, wherein:
the adhesive layer has a third opening which communicates with the first and second openings;
the support base member comprises:
    a resin sheet comprising a top surface and a bottom surface opposite to the top surface;
    a first metal layer formed on the top surface of the resin sheet; and
    a second metal layer formed on the bottom surface of the resin sheet;
a through hole of the resin sheet communicates with an opening of the first metal layer and an opening of the second metal layer;
the second opening has: the through hole of the resin sheet; the opening of the first metal layer; and the opening of the second metal layer; and
an inner wall of the opening of the first metal layer is located outside an inner wall of the third opening and an inner wall of the through hole of the resin sheet.

5. The wiring board according to claim 1, wherein:
the adhesive layer has a third opening which communicates with the first and second openings;
the support base member comprises:
    a resin sheet comprising a top surface and a bottom surface opposite to the top surface;
    a first metal layer formed on the top surface of the resin sheet; and
    a second metal layer formed on the bottom surface of the resin sheet;
a through hole of the resin sheet communicates with an opening of the first metal layer and an opening of the second metal layer;
the second opening has: the through hole of the resin sheet; the opening of the first metal layer; and the opening of the second metal layer; and
no step is formed between an inner wall of the opening of the first metal layer and an inner wall of the through hole of the resin sheet.

6. A wiring board comprising:
a wiring structure comprising:
    a first insulating layer;
    a first wiring layer formed on a bottom surface of the first insulating layer; and
    a protective insulating layer which covers the bottom surface of the first insulating layer and has a first opening that exposes a portion of the bottom surface of the first wiring layer, wherein the portion of the bottom surface of the first wiring layer, which is exposed through the first opening, serves as a first pad; and a support base member which is bonded to the protective insulating layer with an adhesive layer and has a second opening that exposes the first pad, wherein:

the support base member comprises a top surface on which the adhesive layer is formed and a bottom surface opposite to the top surface; and a diameter of the second opening at the bottom surface of the support base member is smaller than a diameter of the second opening at the top surface of the support base member.

7. The wiring board according to claim 6, wherein:

the diameter of the second opening at the top surface of the support base member is set larger than the diameter of the first opening;

the adhesive layer has a third opening which communicates with the first and second openings; and an inner wall of the third opening is located outside an inner wall of the first opening.

8. The wiring board according to claim 6, wherein:

the wiring structure further comprises:

a second wiring layer which comprises: a top surface; a bottom surface opposite to the top surface; and a side surface between the top surface and the bottom surface, and is electrically connected to the first wiring layer; and a second insulating layer which covers the bottom surface and the side surface of the second wiring layer; and the top surface of the second wiring layer serves as a second pad.

9. The wiring board according to claim 6, wherein:

the adhesive layer has a third opening which communicates with the first and second openings;

the support base member comprises:

a resin sheet comprising a top surface and a bottom surface opposite to the top surface;

a first metal layer formed on the top surface of the resin sheet; and a second metal layer formed on the bottom surface of the resin sheet;

a through hole of the resin sheet communicates with an opening of the first metal layer and an opening of the second metal layer;

the second opening has: the through hole of the resin sheet; the opening of the first metal layer; and the opening of the second metal layer; and an inner wall of the opening of the first metal layer is located outside an inner wall of the third opening and an inner wall of the through hole of the resin sheet.

10. The wiring board according to claim 6, wherein:

the adhesive layer has a third opening which communicates with the first and second openings;

the support base member comprises:

a resin sheet comprising a top surface and a bottom surface opposite to the top surface;

a first metal layer formed on the top surface of the resin sheet; and a second metal layer formed on the bottom surface of the resin sheet;

a through hole of the resin sheet communicates with an opening of the first metal layer and an opening of the second metal layer;

the second opening has: the through hole of the resin sheet; the opening of the first metal layer; and the opening of the second metal layer; and no step is formed between an inner wall of the opening of the first metal layer and an inner wall of the through hole of the resin sheet.

\* \* \* \* \*